(12) United States Patent
Dabral et al.

(10) Patent No.: US 11,158,607 B2
(45) Date of Patent: Oct. 26, 2021

(54) WAFER RECONSTITUTION AND DIE-STITCHING

(71) Applicant: Apple Inc., Cupertino, CA (US)

(72) Inventors: Sanjay Dabral, Cupertino, CA (US); Jun Zhai, Cupertino, CA (US); Kwan-Yu Lai, Campbell, CA (US); Kunzhong Hu, Cupertino, CA (US); Vidhya Ramachandran, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 45 days.

(21) Appl. No.: 16/503,806

(22) Filed: Jul. 5, 2019

(65) Prior Publication Data

US 2020/0176419 A1 Jun. 4, 2020

Related U.S. Application Data

(60) Provisional application No. 62/773,135, filed on Nov. 29, 2018.

(51) Int. Cl.
| | | |
|---|---|---|
| *H01L 25/065* | (2006.01) | |
| *H01L 21/56* | (2006.01) | |
| *H01L 21/768* | (2006.01) | |
| *H01L 21/78* | (2006.01) | |
| *H01L 21/66* | (2006.01) | |

(Continued)

(52) U.S. Cl.
CPC ........ *H01L 25/0657* (2013.01); *H01L 21/561* (2013.01); *H01L 21/568* (2013.01); *H01L 21/76897* (2013.01); *H01L 21/78* (2013.01); *H01L 22/32* (2013.01); *H01L 23/481* (2013.01); *H01L 23/60* (2013.01); *H01L 24/96* (2013.01); *H01L 25/50* (2013.01); *H01L 2224/95001* (2013.01); *H01L 2225/06524* (2013.01);

(Continued)

(58) Field of Classification Search
CPC .............. H01L 24/82; H01L 2224/12105
See application file for complete search history.

(56) References Cited

U.S. PATENT DOCUMENTS

| | | | |
|---|---|---|---|
| 2012/0276716 A1* | 11/2012 | Chandrasekaran | ..... H01L 24/81 438/458 |
| 2014/0124873 A1* | 5/2014 | Jagannathan | ..... H01L 29/66545 257/407 |

(Continued)

FOREIGN PATENT DOCUMENTS

DE 102017118183 A1 3/2018

OTHER PUBLICATIONS

Rachid Amrani et al., "Low Temperature Growth of Hydrogenated Silicon Prepared by PECVD from Argon Diluted Silane Plasma" Crystal Structure Theory and Applications, 2012, 1, 62-67, Received from http://file.scirp.org/pdf/CSTA_2012123114595810.pdf, published Nov. 23, 2012, 6 pgs.

(Continued)

*Primary Examiner* — Sitaramarao S Yechuri
(74) *Attorney, Agent, or Firm* — Aikin & Gallant, LLP

(57) ABSTRACT

Stitched die packaging techniques and structures are described in which reconstituted chips are formed using wafer reconstitution and die-stitching techniques. In an embodiment, a chip includes a reconstituted chip-level back end of the line (BEOL) build-up structure to connect a die set embedded in an inorganic gap fill material.

19 Claims, 20 Drawing Sheets

(51) Int. Cl.
  *H01L 23/48* (2006.01)
  *H01L 23/60* (2006.01)
  *H01L 23/00* (2006.01)
  *H01L 25/00* (2006.01)
(52) U.S. Cl.
  CPC .............. *H01L 2225/06541* (2013.01); *H01L 2225/06596* (2013.01); *H01L 2924/30205* (2013.01)

(56) References Cited

U.S. PATENT DOCUMENTS

| | | | |
|---|---|---|---|
| 2017/0207147 A1 | 7/2017 | Liao et al. | |
| 2017/0271307 A1* | 9/2017 | Hiner | H01L 24/95 |
| 2017/0301650 A1* | 10/2017 | Yu | H01L 25/0652 |
| 2017/0352613 A1 | 12/2017 | Baloglu et al. | |
| 2018/0005987 A1* | 1/2018 | Hiner | H01L 24/97 |
| 2018/0096973 A1* | 4/2018 | Shen | H01L 21/31051 |
| 2018/0350595 A1* | 12/2018 | Srinivasan | H01L 21/02164 |
| 2019/0189503 A1* | 6/2019 | Chu | H01L 21/76892 |
| 2020/0083189 A1* | 3/2020 | Chen | H01L 23/49816 |

OTHER PUBLICATIONS

Prof. Saraswat, "Interconnections: Copper & Low K Dielectrics", EE311 Notes, Stanford Univ., Retrieved from https://web.stanford.edu/class/ee311/NOTES/Interconnect_Cu.pdf, posted May 15, 2006, 22 pgs.
Prof Saraswat, "Interconnections: Aluminum Metallization",EE 311,Al Interconnect, Retrieved from https://web.stanford.edu/class/ee311/NOTES/Interconnect_Al.pdf, posted Apr. 27, 2004, 25 pgs.
Voutsas et al., "Sputtering Technology of Si Films for Low-Temperature Poly-Si TFTs", Retrieved from https://cgi.sharp-world.com/corporate/info/rd/tj3/pdf/8.pdf, posted May 24, 2001, 8 pgs.
Hattori, "Challenges of Smaller Particle Detection on Both Bulk-Silicon and SOI Wafers", Sony Corporation Japan, Retrieved from https://aip.scitation.org/doi/pdf/10.1063/1.2062936, posted Sep. 9, 2005, 43 pgs.
Davood Shahrjerdi et al., "Extremely Flexible Nanoscale Ultrathin Body Silicon Integrated Circuits on Plastic", IBM T. J. Watson Research Center, Yorktown Heights, New York 10598, United States, Retrieved from http://engineering.nyu.edu/nanolab/sites/engineering.nyu.edu.nanolab/files/uploads/Nano%20Lett%202013.pdf, posted Dec. 18, 2012, 6 pages.
Richard L. Chaney and Doug R. Hackler, "Solving Integration Challenges for Flexible Hybrid Electronics", Nano for Defense Conference, © 2015 American Semiconductor, Inc., Retrieved from http://www.americansemi.com/uploads/8/5/5/7/85579512/2015_nt4d_fhe_integration.pdf, published Nov. 17, 2015, 14 pgs.
Brian Meek, Dale Wilson, "Flexible Hybrid Electronics (FHE) Assembly Using Low-Temp Solder on PET", © 2018 American Semiconductor, Inc., Retrieved from https://www.americansemi.com/uploads/1/0/8/4/108441507/18-08-06_flex-soc_low_temp_solder_demo.pdf, published Aug. 6, 2018, 2 pgs.
Rich Chaney, Doug Hackler, Dale Wilson, "Flexible Hybrid Electronics: System Design & Reliability", Next Generation Flexible Hybrid Health Monitoring Devices SEMICON West, Retrieved from http://www.americansemi.com/uploads/8/5/5/7/85579512/2016_semicon.pdf, published Jul. 13, 2016, 19 pgs.
Joachim N. Burghartz, "Make Way for Flexible Silicon Chips", IEEE Spectrum, Retrieved from https://spectrum.ieee.org/semiconductors/materials/make-way-for-flexible-silicon-chips, published Feb. 25, 2013, 5 pgs.
Christine Harendt, "Chip-Film Patch (CFP) technology", Retrieved from https://www.ims-chips.de/home.php?id=a3b18c1en&adm=, published 2017, 2 pgs.
Christine Harendt, "Ultra-thin chips", Retrieved from https://www.ims-chips.de/home.php?id=a3b8c1en&adm=&suchwort=chipfilm, published 2017, 2 pgs.

N. Maeda, "Development of Ultra-Thin Chip-on-Wafer Process using Bumpless Interconnects for Three-Dimensional Memory/Logic Applications", Graduate School of Engineering, The University of Tokyo, Feb. 11, 2016 Yayoi, Bunkyo-ku, Tokyo 113-8656, Japan, Retrieved from http://sogo.t.u-tokyo.ac.jp/ohba/news/VLSI1206.pdf, published Jul. 19, 2012, 2 pgs.
Sales Engineering Department, "Wafer ultra-thinning process for 3D stacked devices and the influences on the device characteristics", DISCO Technical Review Mar. 2016, Retrieved from https://www.disco.co.jp/eg/solution/technical_review/pdf/TR16-06_Wafer%20ultra-thinning%20process%20for%203D%20stacked%20devices%20and%20the%20influences%20on%20the%20device%20characteristics_20160610.pdf, published Jun. 10, 2016, 5 pgs.
T.S. Ravi, "Technology Development for High-Efficiency Solar Cells and Modules Using Thin (<80 µm) Single-Crystal Silicon Wafers Produced by Epitaxy", NREL Technical Monitor: Harin Ullal Prepared under Subcontract No. NEU-31-40054-01, Retrieved from https://www.nrel.gov/docs/fy13osti/58593.pdf, published Jun. 11, 2011-Apr. 30, 2013, 31 pgs.
Crystal Solar, "Reinventing the way silicon is made", Retrieved from http://xtalsolar.com/reinventing.html, published 2015, 1 pgs.
Wikipedia, "Porous silicon", Retrieved from https://en.wikipedia.org/wiki/Porous_silicon, published last on Mar. 16, 2019, 8 pgs.
Michael J. Sailor, "Fundamentals of Porous Silicon Preparation", Porous Silicon in Practice: Preparation, Characterization and Applications, First Edition., Retrieved from https://application.wiley-vch.de/books/sample/3527313788_c01.pdf, published Jan. 13, 2012, 42 pgs.
Nanopartz, "Spherical Gold Nanoparticles Products and Applications", Retrieved on Nov. 27, 2019 from https://www.nanopartz.com/spherical_gold_nanoparticles.asp, published unknown, 6 pgs.
J. Parsey, "Nano-Processing for High Voltage and High Power Devices", ON Semiconductor, Retrieved from https://www.psma.com/sites/default/files/uploads/tech-forums-nanotechnology/presentations/2013-apec-241-nano-construction-high-power-and-high-voltage-devices.pdf, published Mar. 21, 2013, 21 pgs.
K. Vanstreels et al., "Mechanical Stability of Porous Low-k Dielectrics", N3058, ECS Journal of Solid State Science and Technology, 4 (1) N3058-N3064 (2015), Retrieved from http://jss.ecsdl.org/content/4/1/N3058.full.pdf+html, published Oct. 21, 2014, 7 pgs.
Yuka Tomizawa et al., "Laser doping of boron-doped Si paste for high-efficiency silicon solar cells", Japanese Journal of Applied Physics 54, 08KD06 (2015), Retrieved from https://iopscience.iop.org/article/10.7567/JJAP.54.08KD06, published Jul. 6, 2015, 5 pgs.
Unknown publisher, "DuPont™ Innovalight™", Retrieved from http://www.dupont.co.in/content/dam/dupont/products-and-services/solar-photovoltaic-materials/solar-photovoltaic-materials-landing/documents/dec-Innovalight-brochure.pdf, published Feb. 2012, 3 pgs.
S Ink, "Silicon Ink for High-Efficiency Solar Cells Captures a Share of the Market", Retrieved from https://www.nrel.gov/docs/fy11osti/52215.pdf, published Aug. 2011, 2 pgs.
Unknown publisher, "Materials Matter™", Retrieved from http://www.arpae-summit.com/paperclip/exhibitor_docs/14AE/DuPont_136.pdf, published 2012, 5 pgs.
B. J. Abdullah, "Size Dependence of the Bulk Modulus of Si Nanocrystals", Sådhanå (2018) 43:174, Retrieved from https://www.ias.ac.in/article/fulltext/sadh/043/11/0174, published Sep. 12, 2018, 5 pgs.
AMICRA Microtechnologies, "Products", Enabling the Digital World, ASM AMICRA Microtechnologies, Retrieved from http://amicra.com/download/ASMAMICRAProductOverviewJune2018LR.pdf, published Jun. 2018, 2 pgs.
Applied Materials, Inc., "Scaling Dielectric GAP Fill", vol. 10, Issue 1, 2012, Nanochip Technology Journal, Retrieved from http://www.appliedmaterials.com/files/nanochip-journals/NanochipTechJournal_Vol10Issue1_Dec2011_Security.pdf#page=10, published 2012, pp. 9-12.
P. Alpuim et al., "Doping of amorphous and microcrystalline silicon films deposited at low substrate temperatures by hot-wire chemical vapor deposition", Retrieved from https://repositorium.sdum.uminho.pt/bitstream/1822/5553/5/manuscript.pdf, published Sep. 13, 2001, 29 pgs.

(56) References Cited

OTHER PUBLICATIONS

V Verlaan, "Silicon Nitride at High Growth Rate Using Hot Wire Chemical Vapor Deposition", Retrieved from https://dspace.library.uu.nl/handle/1874/30002, published 2008, 1 pgs.

D. C. Bobela, C. W. Teplin, D. L. Young, H. M. Branz, P. Stradins, "Epitaxial crystal silicon absorber layers and solar cells grown at 1.8 microns per minute", Proc. 37th IEEE Photovoltaic Spec. Conf., pp. 2982-2986, Retrieved from https://www.nrel.gov/docs/fy11osti/50708.pdf, Jun. 2011.

Howard M. Branz, "Film Crystal Silicon Photovoltaics by Hot-Wire Chemical Vapor Deposition Epitaxy on Seed Layers", National Renewable Energy Laboratory, Retrieved from https://www.youtube.com/watch?v=1QU5YEEr0zg, published Oct. 7, 2011.

Cheng, K. et al., "Air Spacer for 10nm FinFET CMOS and Beyond" IEDM16-445, retrieved from https://ieeexplore.ieee.org/document/7838436, published Feb. 2, 2017, 4 pgs.

Alberi, K. et al., "Localized Doping Using Silicon Ink Technology for High Efficiency Solar Cells", retrieved from https://ieeexplore.ieee.org/document/5614442, published Nov. 1, 2010, 4 pgs.

Gardner, D. S. et al., "Integrated On-Chip Energy Storage Using Porous-Silicon Electrochemical Capacitors", vol. 25, Jul. 2016, pp. 68-79, retrieved from https://www.sciencedirect.com/science/article/abs/pii/S2211285516300074X, published on Apr. 13, 2016, 4 pgs.

Antoniadis H., "Silicon Ink High Efficiency Solar Cells", retrieved from https://ieeexplore.ieee.org/document/5411597, published on Feb. 17, 2010, 5 pgs.

Yeh, M. L. et al., "Integration of Cu Damascene with Pore-sealed PECVD Porogen Low-k (k=2.5) Dielectrics for 65nm Generation", retrieved from https://ieeexplore.ieee.org/document/4016635, Published on Nov. 30, 2006, 2 pgs.

Kim, Y. S. et al., "Ultra Thinning down to 4-μm using 300-mm Wafer proven by 40-nm Node 2Gb DRAM for 3D Multi-stack WOW Applications", 2014 Symposium on VLSI Technology Digest of Technical Papers, retrieved from https://ieeexplore.ieee.org/document/6894347, Published on Sep. 11, 2014, 2 pgs.

Yoon, S. J. et al., "Selective Pore-Sealing of Highly Porous Ultralow-k dielectrics for ULSI Interconnects by Cyclic Initiated Chemical Vapor Deposition Process", 2018 Symposium on VLSI Technology Digest of Technical Papers, received from https://ieeexplore.ieee.org/document/8510630, Published on Oct. 29, 2018, 2 pgs.

Moinpour, M., "Materials Challenges in Planarization and Interconnect Technologies", retrieved from https://ieeexplore.ieee.org/document/5760415/authors#authors, Published on Jun. 1, 2011, 6 pgs.

Yamauchi, S. et al., "Defect-Less Trench Filling of Epitaxial Si Growth by H2 Annealing" retrieved from https://ieeexplore.ieee.org/document/1016189, Published on Aug. 7, 2002, 4 pgs.

Magomedov, M. N., "Size Dependence of the Shape of a Silicon Nanocrystal during Melting", Original Russian Text © M.N. Magomedov, 2016, published in Pis'ma v Zhurnal Tekhnicheskoi Fiziki, 2016, vol. 42, No. 14, pp. 94-102., retrieved from https://www.researchgate.net/publication/306076166_Size_dependence_of_the_shape_of_a_silicon_nanocrystal_during_melting, Published on May 29, 2018, 5 pgs.

Grigoras, K., "Porous Silicon Electrodes for High Performance Integrated Supercapacitors" retrieved ABSTRACT from https://ieeexplore.ieee.org/document/6962717/figures#figures, published on Nov. 24, 2014, 1 pg.

International Application No. PCT/US2019/062702, "International Search Report and Written Opinion" dated Jul. 21, 2020, 25 pages.

International Application No. PCT/US2019/062702, "Invitation to Pay Additional Fees" dated Apr. 22, 2020, 18 pages.

\* cited by examiner

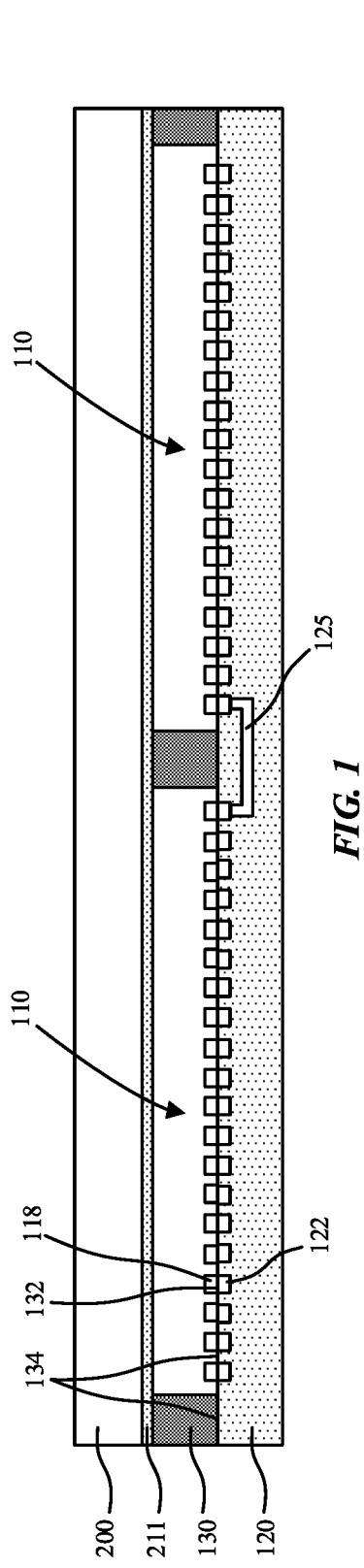
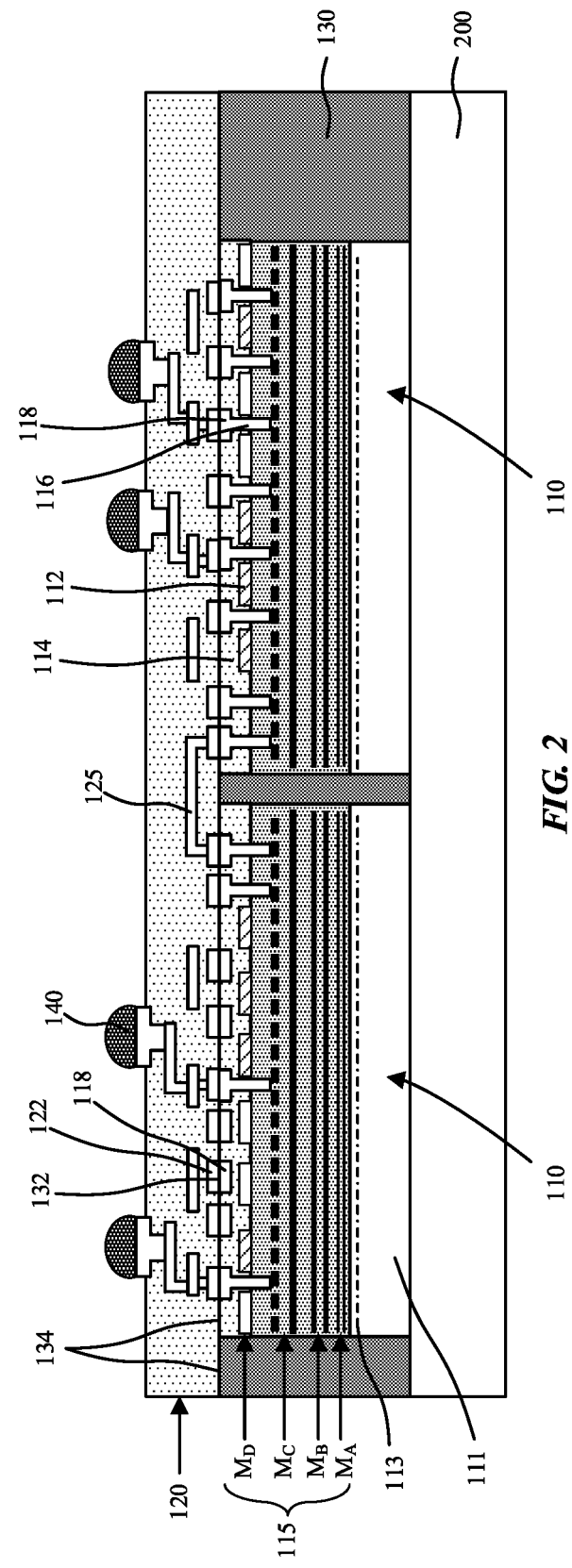

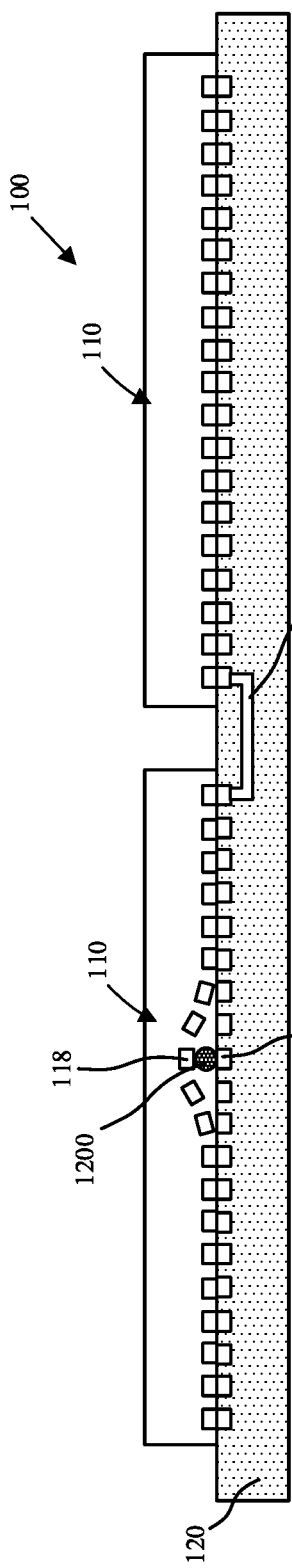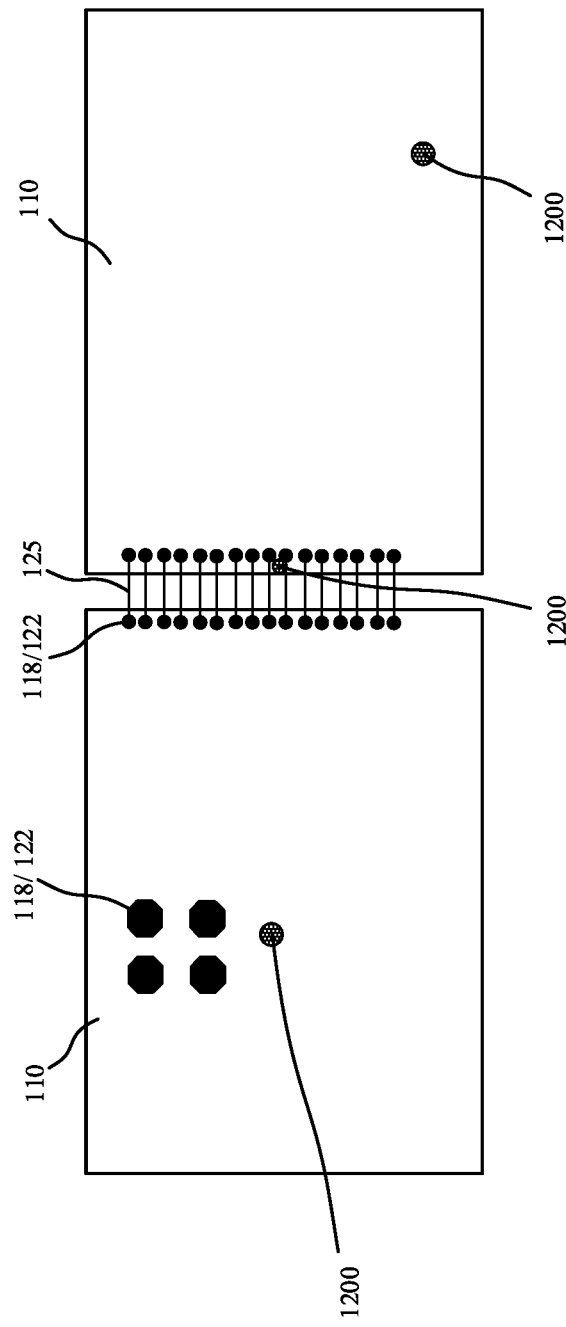

WAFER RECONSTITUTION AND DIE-STITCHING

RELATED APPLICATIONS

This application claims the benefit of priority from U.S. Provisional Patent Application Ser. No. 62/773,135 filed on Nov. 29, 2018, the full disclosure of which is incorporated herein by reference.

BACKGROUND

Field

Embodiments described herein relate to integrated circuit (IC) manufacture, and the interconnection of multiple dies.

Background Information

A multi-chip module (MCM) is generally an electronic assembly in which multiple dies are integrated on a substrate. Various implementations of MCMs include 2D, 2.5D and 3D packaging. Generally, 2D packaging modules include multiple dies arranged side-by-side on a package substrate. In 2.5D packaging technologies multiple dies are bonded to an interposer with microbumps. The interposer in turn is then bonded to a package substrate. The interposer may include routing to interconnect the adjacent dies. Thus, the dies in 2.5D packaging can be directly connected to the interposer, and are connected with each other through routing within the interposer. Generally, 3D packaging modules include multiple dies stacked vertically on top of each other. Thus, the dies in 3D packaging can be directly connected to each other, with the bottom die directly connected to a package substrate. The top die in a 3D package can be connected to the package substrate using a variety of configurations, including wire bonds, and through-silicon vias (TSVs) though the bottom die.

Chip on wafer (CoW) is a particular side-by-side packaging configuration which can be utilized to provide dense wiring, heterogeneous integration, and is scalable. In a particular configuration, hybrid bonding between the dies and interposer can be utilized with metal-metal and oxide-oxide bonding to achieve a high connection density by avoiding the use of solder bumps for die to interposer connections.

SUMMARY

Stitched die packaging solutions including wafer reconstitution and die-stitching techniques are described. In an embodiment a chip includes a reconstituted chip-level back end of the line (BEOL) build-up structure including a plurality of interconnects, a die set on the reconstituted chip-level BEOL build-up structure, and an inorganic gap fill material on the reconstituted chip-level BEOL build-up structure and surrounding the die set. The inorganic gap fill material may be formed of an oxide, oxynitride (e.g. $SiO_xN_y$), multiple oxynitride with variable ratios and thickness, or silicon matrix for example. In an embodiment, the reconstituted chip-level BEOL build-up structure includes intra-die interconnections for a first die of the die set, intra-die interconnections for a second die of the die set, and die-to-die interconnections between the first die and the second die. The wafer reconstitution sequences may be performed with both die face-up and face-down processing sequences. In an embodiment, a method of fabricating a reconstituted wafer includes mounting a plurality of groups of die sets face down onto a first carrier substrate; depositing a gap fill material onto the first carrier substrate and laterally surrounding each die of the plurality of groups of die sets, bonding a second carrier substrate opposite the first carrier substrate, and removing the first carrier substrate. The gap fill material may include an inorganic matrix material such as an oxide or silicon, for example. A reconstituted chip-level BEOL build-up structure can then be formed on the front sides of the plurality of groups of die sets and the gap fill material. In an embodiment a back side reconstituted chip-level BEOL build-up structure is formed on exposed through silicon vias on back sides of the plurality of groups of die sets.

In an embodiment, a method of fabricating a reconstituted wafer includes mounting a plurality of groups of die sets face up onto a first carrier substrate, and depositing a gap fill material onto the first carrier substrate and laterally surrounding each die of the plurality of groups of die sets. The gap fill material may include an inorganic matrix material such as an oxide or silicon, for example. A reconstituted chip-level BEOL build-up structure can then be formed on the plurality of groups of die sets and the gap fill material.

The wafer reconstitution sequences in accordance with embodiments may be extended to 3D packing solutions, such as a wafer on wafer (or wafer to wafer) process which includes bonding a first reconstituted wafer of known good dies to a second reconstituted wafer of known good dies, followed by singulation of a plurality of 3D reconstituted chips.

BRIEF DESCRIPTION OF THE DRAWINGS

FIG. 1 is a schematic cross-sectional side view illustration of a CoW packaging technique.

FIG. 2 is a schematic cross-sectional side view illustration of a die-to-interposer CoW interface.

FIG. 12A is a schematic cross-sectional side view illustration showing a particle during wafer reconstitution and hybrid bonding phase of a CoW process.

FIG. 12B is a schematic top view illustration showing particle sensitivity on a CoW hybrid bonding process.

DETAILED DESCRIPTION

Figure 3:
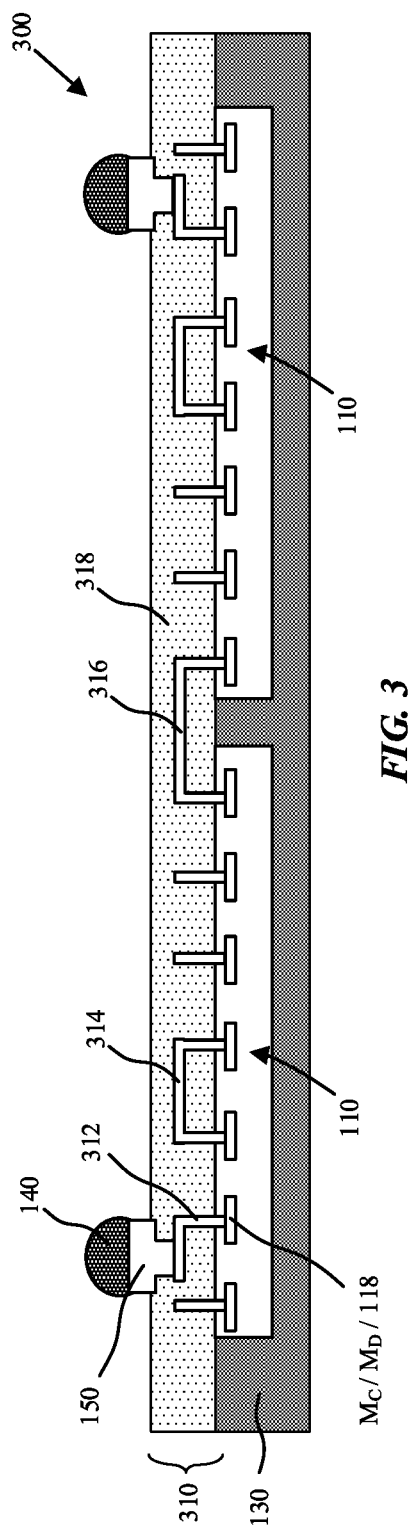
FIG. 3 is a schematic cross-sectional side view illustration of a chip fabricated with a wafer reconstitution and die-stitching technique in accordance with an embodiment.

Embodiments describe a 2.5D packaging solution in which a chip may include a reconstituted chip-level back end of the line (BEOL) build-up structure including a plurality of interconnects, a die set on the reconstituted chip-level BEOL build-up structure, and an inorganic gap fill material on the reconstituted chip-level BEOL build-up structure and surrounding the die set.

Some aspects of embodiments may include wafer reconstitution with back end of the line (BEOL) interconnections to form side-by-side (SBS) heterogenous interconnects. Reconstitution using inorganic materials (e.g. oxide, silicon) may allow for higher temperature process, as well as finer feature sets. The reconstituted wafers can be known good reconstituted wafers (KGRW) for wafer on wafer (WoW) processes, thereby improving yield.

In some aspects, reconstituted chip-level BEOL interconnections can form (inter) die-to-die (D2D) interconnects, as well as (intra) on-chip interconnect (supporting). The reconstituted chip-level BEOL interconnections may include aluminum damascene interconnects in some embodiments. For example, these may be single damascene (two steps) or dual damascene using electro-deposition, for example. The particular configurations of the die (active side up) with inorganic dielectric in the reconstituted chip-level BEOL build-up structure can enable standard via and interconnect process path.

In some aspects, the packaging scheme can minimize or remove altogether electrostatic discharge (ESD) protection on the dies (therefore closer to on-chip like bus). This can reduce capacitance and area.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer between layers may be directly in contact with the layers or may have one or more intervening layers.

In one aspect, embodiments describe stitched-die chip structures that can realize the benefits of both CoW and BEOL interconnection techniques while avoiding many of the associated potential drawbacks. For example, several CoW beneficial properties include being heterogenous (uses different substrates), dense I/O per unit area, dense wiring per mm, scalability, being repartition and reintegration friendly, and providing die placement accuracy. Some potential drawbacks of CoW include expense of integrating a hybrid bonding fabrication line into a facility, maturity of the technology, particle sensitivity (especially during test, dicing), and high temperature for hybrid bonding.

BEOL interconnection technology beneficial properties include being a mature process (which affects yield and expense), providing dense I/O per unit area, dense wiring per mm, scalability, being less particle sensitive compared to CoW (especially during test, dicing), and use of moderate temperatures. Some potential drawbacks include being homogeneous (same substrate), and repartition and reintegration can be harder (e.g. due to fixed placement, reticle cost to reconfigure, etc.).

The stitched die packaging techniques in accordance with embodiments may get the best of both CoW and BEOL options. For example, embodiments may draw heterogeneity from CoW with the reconstituted wafer. Additionally, embodiments may draw dense IO, die placement accuracy, and the repartition and reintegration friendliness from CoW. Embodiments may also draw beneficial properties from BEOL including process maturity, dense IO, dense wiring, scalability, less particle sensitivity, and moderate temperatures.

Referring now to FIG. 1 a cross-sectional side view illustration is provided of CoW packaging technique in which side-by-side (SBS) dies 110 are hybrid bonded to an interposer 120, and secured with an oxide gap fill 130. As shown, metal-metal bonds 132 can be made between the die pads 118 and interposer pads 122. Additionally, oxide-oxide bonds 134 may be formed between the dies and interposer, as well as the oxide gap fill and interposer. It has been observed that such a CoW technique may incite costs due to being very sensitive to particulates, and need to maintain strict environmental control during hybrid bonding. Additionally, hybrid bonding lines can be a major non-recurring expense. Another drawback is that the oxide gap fill 130 has a thermal expansion CTE mismatch with silicon. Also forming the oxide gap fill is slow and costly. This can also impose restrictions of a thin die 110 (e.g. less than 20 microns) and substrate size. See for example, the schematic cross-sectional side view illustration of a die-to-interposer CoW interface in FIG. 2 which shows the dies 110 after hybrid bonding to interposer 120 and bump 140 placement, and prior to removal of carrier substrate 200. FIG. 2 additionally illustrates die-level BEOL build-up structure 115 routing, which can include one or more metal and dielectric layers, formed over the active devices 113 formed in a semiconductor substrate 111. Each die 110 includes both the semiconductor substrate 111 and a die-level BEOL build-up structure 115. Die-level BEOL build-up structure 115 may be formed using traditional BEOL processing techniques, such as damascene, etc. Die-level BEOL build-up structure 115 may include wiring layers such as lower wiring layer MA, middle wiring layers MB, MC, and upper wiring layers MD. As illustrated, the wiring layers may optionally have different thicknesses, with MD being the thickest, and MA being the thinnest (and finest, e.g. width). Additionally, die 110 preparation after testing (e.g. testing of the Al test pad 112) can be a major recurring cost factor for CoW. Furthermore, as shown in FIG. 2, the die 110 preparation after test includes building an extra oxide 114 and copper via 116 (minimum height required for bonding) and then a metal pad 118 before bonding to interposer 120.

The packaging solutions including wafer reconstitution and die-stitching technique in accordance with embodiments may keep the best features of CoW and BEOL. This can be accomplished using an oxide and integrating matrix to reconstitute a good high yielding wafer (known good reconstituted wafer (KGRW)). This supports accurate alignment, heterogeneous die integration, and die partitioning. BEOL interconnects can be used to connect the die with a very high I/O area density (e.g. 5-10 µm pitch). A suitable number of coarser pitch metallization layers, or even final metallization layer can be used to provide high wiring density. Additionally, no hybrid bonding is required, which can lower associated costs and improve yield. This can further lower risk and development time. Die peripheral yield loss may be managed by feature size to particle size ratio. The reconstitution sequence may be less sensitive to die (center) area yield loss.

The reconstituted chips fabricated with a wafer reconstitution and die-stitching techniques in accordance with embodiments may achieve on-chip like wire (or very close) densities (a design collateral). Wires can have improved T-line performance and can be used for spanning longer distance. Wiring can additionally be good for clock distribution, particularly for larger spans. With the high density wiring, the number of layers can be tuned. Wires are also available to regular on-chip circuits (e.g. can route on-chip buses). Repeaters can be formed in the active silicon. There are also test considerations for the wiring, such as a portion of the bus can be provided in the die (before integration). This enables test. Then, the full buses can be routed on top to provide full functionality and bandwidth. Overall, implementation of the BEOL wiring can provide the look and feel and usage closer to on-chip environment.

The reconstituted chips fabricated with a wafer reconstitution and die-stitching techniques in accordance with embodiments may also minimize (or eliminate electrostatic discharge (ESD) circuits) in the die-to-die connections requiring less area, and reducing parasitic capacitance. ESD may still be provided in the reconstituted chip-level BEOL wiring for the chip external pads.

FIG. 3 is a schematic cross-sectional side view illustration of a chip 300 fabricated with a wafer reconstitution and die-stitching technique in accordance with an embodiment. As illustrated, the chip 300 includes a plurality of side-by-side dies 110, which can be partitioned system on chip dies, heterogenous dies from different wafers, and from different process nodes, etc. The die 110 sets are encapsulated in a gap fill 130 material, which may be an oxide (e.g. silicon oxide) or silicon, for example. A reconstituted chip-level BEOL build-up structure 310 is formed over the dies 110 and gap fill 130, the chip-level BEOL build-up structure 310 including vias 312, on-chip (intra-chip) wiring 314, and die-to-die (D2D) interconnect (wiring) 316 between the dies 110 and one or more dielectric layers 318. The reconstituted chip-level BEOL build-up structure 310 in some embodiments may include final metallization layer and/or coarser pitch metallization layers, for example. In an embodiment, the metallization layers may be thicker layers, for example equivalent thickness or thicker than the upper wiring layers (e.g. $M_D$) for the die-level BEOL build-up structures 115. Traditional damascene or dual damascene via connections between wiring layers may be utilized in accordance with some embodiments.

In accordance with embodiments, the reconstituted chip-level BEOL build-up structure 310 wiring makes electrical connection to the die-level build-up structures 115 for the dies 110. This may be accomplished with Cu—Cu wiring, Al—Al wiring, and combinations of Cu—Al wiring processes. In an embodiment, die-level BEOL build-up structures 115 can include primarily Cu wiring, with an upper wiring layer (e.g. $M_D$) including test pads being formed of Al. In an embodiment, the reconstituted chip-level BEOL build-up structure 310 wiring includes equivalent or thicker wiring layers (though finer wiring is possible) than the upper wiring layer (e.g. $M_D$) of the die-level build-up structures 115, or a wiring layer to which contact is made (e.g. $M_C$). The reconstituted chip-level BEOL build-up structure 310 can be formed using either Cu or Al wiring processes. In an embodiment, the reconstituted chip-level BEOL build-up structure 310 uses an Al wiring process, which may optionally use (single) damascene vias 312. Vias 312 used to contact the die-level BEOL build-up structures 115 though may also be formed of Cu in accordance with embodiments. In some embodiments, the quality of service can be used to organize metal usage based on requirements such as latency, power, etc.

Exemplary methods of forming an oxide gap fill include chemical vapor deposition (CVD), plasma enhanced CVD (PECVD), sub-atmospheric CVD (SA-CVD) and selective oxide deposition (SELOX). Such oxide deposition techniques are epitaxial techniques commonly performed at high temperatures, are comparatively slow, and comparatively expensive. Exemplary methods for forming a silicon gap fill include epitaxial techniques such as CVD, PECVD, low pressure CVD (LPCVD), and hot wire CVD, as well as sputtering, silicon ink, silicon paste, and electro-deposition. However, epitaxial techniques such as PECVD and LPCVD may be performed at lower temperatures, while hot wire CVD may have significantly higher deposition rates. Electro-deposition may be performed using ionic liquids at low temperatures. Additionally, silicon inks and pastes may be deposited at low temperatures followed by reflows at low temperatures due to depressed melting point of silicon nanoparticles. Notably, available techniques for the formation of silicon gap fill may be performed at lower temperatures, with shorter deposition times, and potentially less expensive equipment. This can affect both throughput and cost. Where a silicon material is used to provide a gap fill 130 material and integrating matrix, the silicon gap fill 130 material can be mechanically clean (i.e. good CTE match). The silicon gap fill 130 material can also allow for inclusion of thicker (active) die 110 (e.g. 50 μm thick) compared to an oxide gap fill 130 material, that may be restricted to less than 20 μm height. Furthermore, a silicon gap fill material may allow for use of larger carrier substrate 200 options (like 200 mm, 300 mm wafers or 500×500 mm panels or larger) during fabrication. Silicon may also be lower cost (e.g. silicon can be electro-deposited, sputtered, deposited with low temperature chemical vapor deposition, or with inks or paste, for example), and can be done at low temperatures (e.g. less than 250° C., with less than 120° C. potentially feasible). With the silicon option, wafers can be made "prime" after cleaning. Silicon processing can also re-introduce the process to a mature clean fab (e.g. a mature larger generation fab such as 90 nm or 180 nm process node, which can reduce non-recurring expenses).

Utilizing a silicon material for the gap fill in accordance with embodiments may both allow for thicker die 110 options (improved heat spreading for hot spots) and improve thermal contact with the die 110 (e.g. silicon) to gap fill 130 (silicon). Referring briefly again to FIG. 1 such a comparison for a CoW thin oxide gap fill 130 is illustrated. As shown, in a CoW implementation, the dies 110 may need to be less than 20 μm thick. Otherwise, the oxide gap fill 130 may crack due to stress. An oxide attach film 211 (between the dies 110 and the mechanical handling silicon substrate 200) may be additionally included, though this is very thin, and provides only a small increase in thermal resistance.

Notably, the silicon gap fill is independent of wiring. Silicon gap filled reconstituted wafers could also be used for CoW/hybrid bonding processes.

Referring now to FIG. 3, a silicon gap fill 130 material can more feasibly be made thicker than an oxide gap fill material, and may be formed over the dies 110, and may also allow for thicker dies 110. Irrespective of the gap fill 130 material selections, the dies 110 may have at least some partial metal wiring. For example, this may include at least traditional fine pitch BEOL wiring (e.g. MA). For example, these may include 12-18 metal layers in current technologies and possibly more in the future. These wires can include fine wiring (e.g. MA) near the active devices 113 (transistors), and then going to BOEL like (e.g. MB, MC, MD) with 0.4 to 0.8 μm pitch. Each die 110 may include sufficient wiring, and test pads 112 (e.g. aluminum pads, similar to FIG. 2) for circuit testing to identify good known dies. The wiring need not be complete, or circuits need not be complete, beyond testing requirements. Final connections may be made in the reconstituted chip-level BEOL build-up structure 310.

The reconstituted chip-level BEOL build-up structure (inclusive of the dielectric (oxide) layer 318 illustrated) can include similar or coarser wiring than within the die wiring. For example, the intra-chip wiring 314 in the reconstituted chip-level BEOL build-up structure 310 may include a tight I/O pitch of 2-10 um, defined by process, with no ESD protection. The die-to-die (D2D) interconnect (wiring) 316 may include similar pitch, with minimal or no ESD protection. The external chip pads 150 (e.g. may be aluminum) may have even looser I/O pitch, such as 60-130 μm, defined by flip chip bump pitch considerations.

Figure 4:
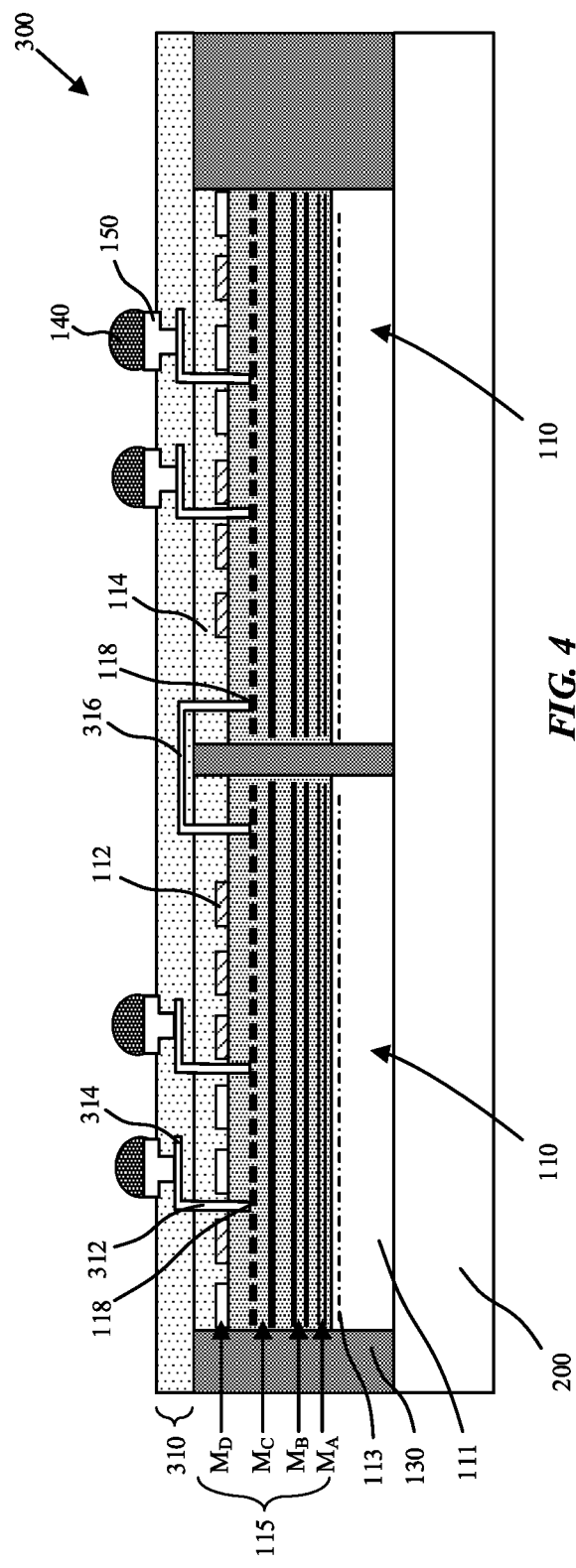
FIG. 4 illustrates a back end of the line wiring for contact with inner chip layers in accordance with an embodiment.

FIG. 4 illustrates a back end of the line wiring sequence during fabrication of reconstituted chip-level BEOL build-up structure 310 for contact with inner chip layers in accordance with embodiments. As shown, the reconstituted chip-level BEOL build-up structure can include one or a plurality of metal interconnect layers and may include damascene connections. Additionally, deep vias 312 may be formed through the die-level BEOL layers to contact die metallization. This may avoid the top metal layer (e.g. $M_D$) including the test pads 112. Accordingly, via 312 connections may be etched and formed into the die-level BEOL build-up structure 115 layers to connect with the die-level BEOL layers, while bypassing the testing pads 112. Additionally, metal layers in the reconstituted chip-level BEOL build-up structure 310 may be used to make D2D interconnects 316, which may also utilize the aforementioned vias 312. External chip pads 150 may then be formed, followed by application of (solder) bumps 140.

Figure 5:
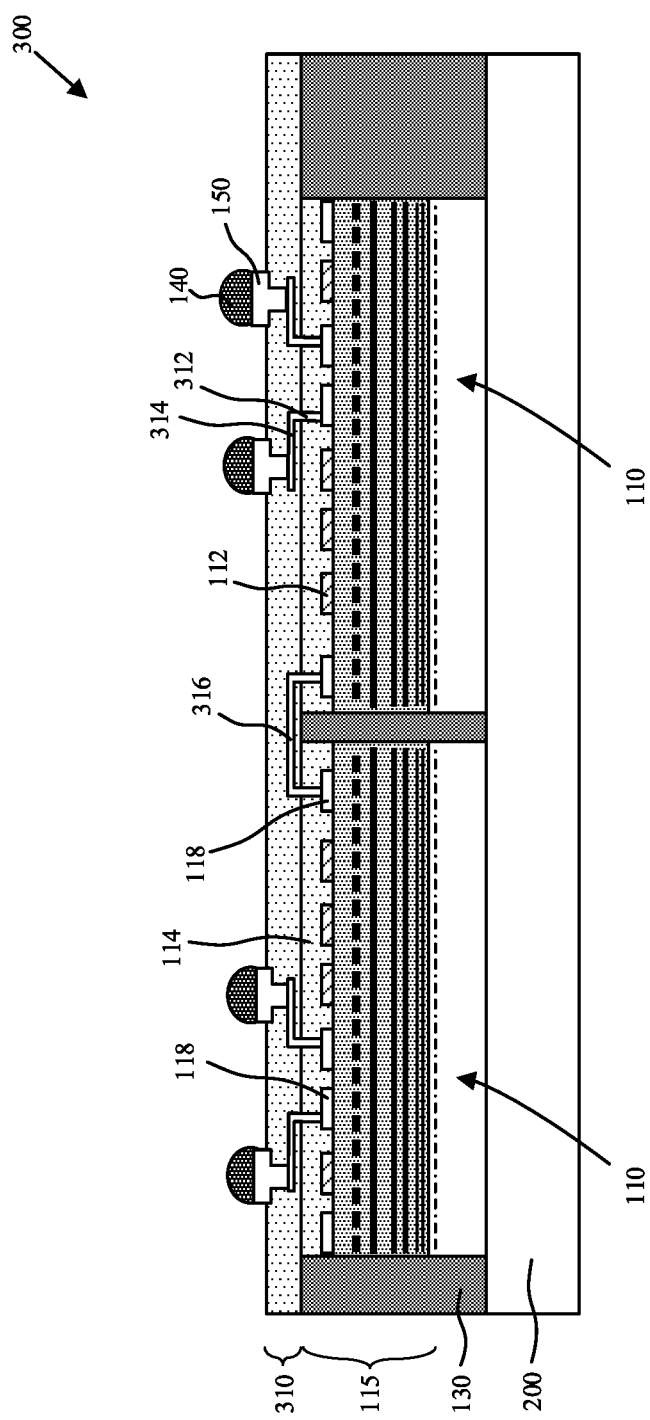
FIG. 5 illustrates a back end of the line wiring for contact with a top metal layer in accordance with an embodiment.

FIG. 5 illustrates a back end of the line wiring sequence for contact with a top metal layer in accordance with embodiments. FIG. 5 is similar to FIG. 4 with one difference being that the via 312 contacts make contact with the top metal layer (e.g. MD) pads 118. Thus, the vias may be shallower vias by comparison, and via pitch may be limited by die pad 118 pitch. In an embodiment, the pads 118 for D2D interconnects 316 may be of finer pitch than the external chip pads 150 for the chip 300 (e.g. for flip chip). This structure may also be beneficial for power delivery.

Figure 6:
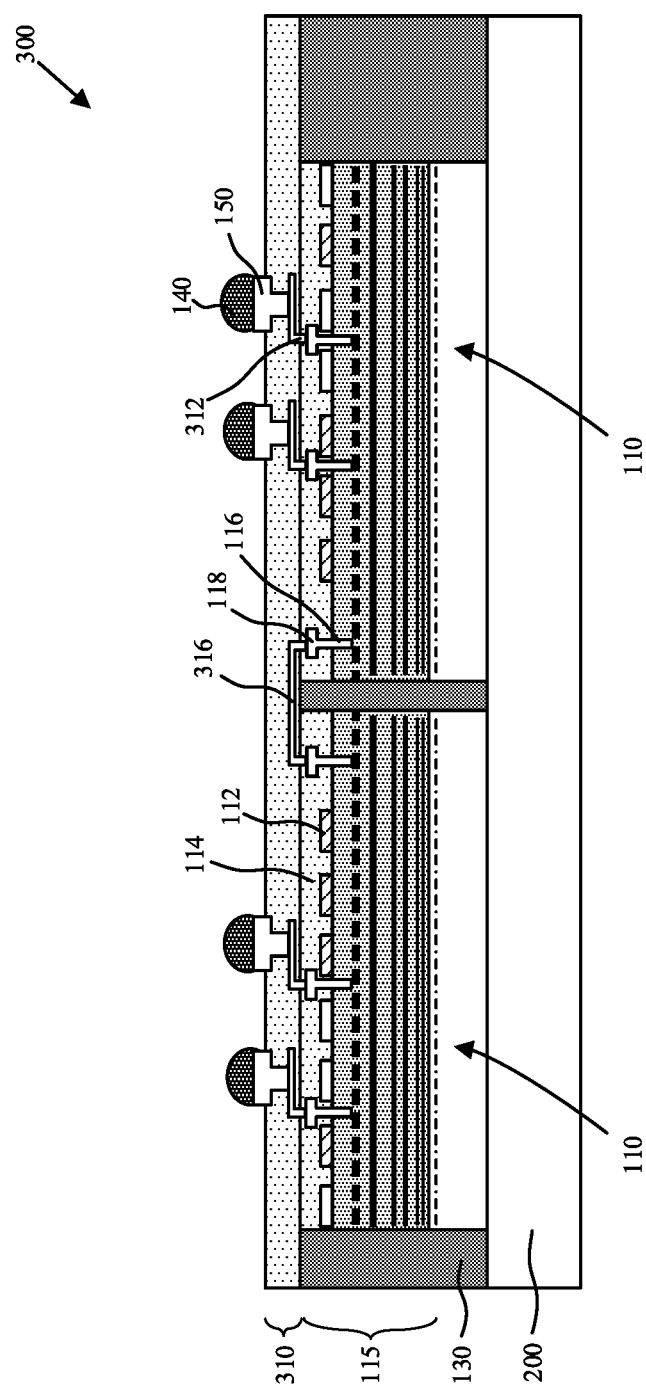
FIG. 6 illustrates a back end of the line wiring for via and pad built in the original die in accordance with an embodiment.

Referring now to FIG. 6 a back end of the line wiring sequence is illustrated for vias 116 and pads 118 built in the original die 110 in accordance with embodiments. In such an embodiment, the die 110 vias 116 and pads 118 may be fabricated while in the initial wafer format, after testing. Thus, after testing a thin oxide 114 can be formed over the illustrated top metal layer test pads 112. The die-level BEOL build-up structure 115 vias 116 and pads 118 are then formed after testing, followed by dicing of the known good dies 110. Then, the reconstituted wafer process is performed, and the reconstituted chip-level build-up structure 310 and intra-die interconnects 314 are formed, as well as D2D interconnects 316. In this instance, shallower reconstituted chip-level vias 312 may be required in the reconstituted chip-level BEOL build-up structure 310 to contact the die 110 metal. This may be a very fine pitch option, with die placement accuracy limited. If area is larger, reticle stitching can be performed. Lastly, external bumps 140 are applied. Some physical characteristics of the embodiment of FIG. 6 include finer pitch shallower via in the reconstituted chip-level BEOL process, and the die-level vias 116 and pads 118 are above the probe pads 112.

It is to be appreciated that while FIGS. 4-6 are described and illustrated separately, the via descriptions may be combined in some embodiments. Furthermore, while a single metal or interconnect layer is illustrated in the reconstituted chip-level BEOL build-up structure 310, it is understood multiple metal or interconnect layers may be formed, and may have different thicknesses (e.g. $M_C$, $M_D$, etc.). In some embodiments, the quality of service can be used to organize metal usage based on requirements such as latency, power, etc.

Figure 7A:
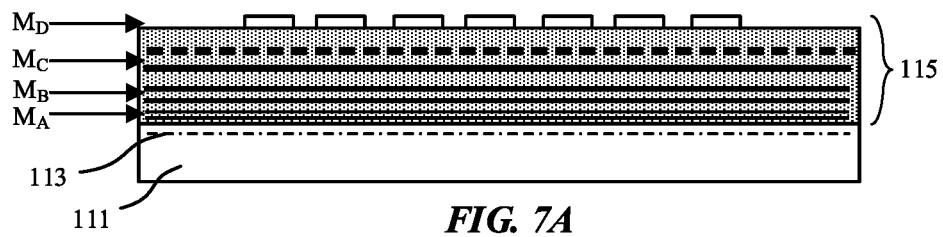
FIGS. 7A-7C are schematic cross-sectional side view illustrations of a die-level BEOL build-up structure processing sequence in accordance with an embodiment.
Figure 7B:
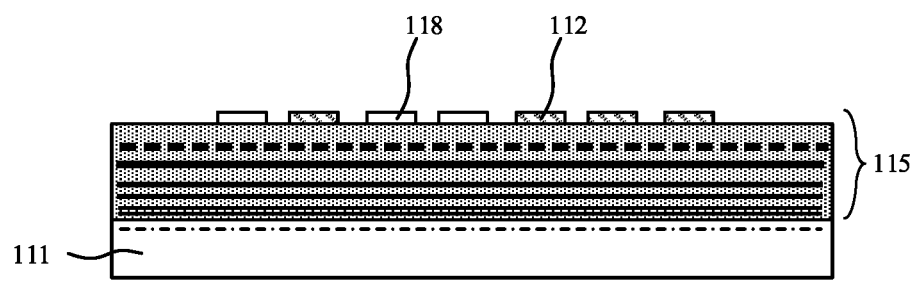
Figure 7C:
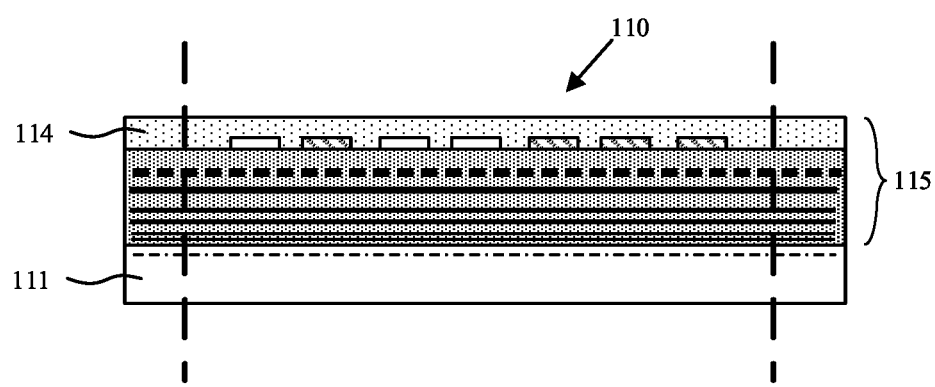

FIGS. 7A-7C illustrate a die-level BEOL build-up structure 115 processing sequence in accordance with embodiments. As shown in FIG. 7A the process sequence begins with a semiconductor substrate 111 (e.g. silicon wafer) including an active (device) layer including active devices 113, and die-level BEOL build-up structure 115 including very fine pitch metal layers (e.g. $M_A$), coarser pitch metal layers (e.g. $M_B$, $M_C$), and a top metal layer (e.g. $M_D$) which can be aluminum for example. In an embodiment, the die-level BEOL layers include damascene (e.g. single or dual damascene) interconnects. The top metal layer (e.g. $M_D$) may include test pads 112. In an embodiment, the lower metallization layers are fabricated using standard copper processing, while the upper metal layers (e.g. $M_D$, and optionally $M_C$) can be fabricated using aluminum processing.

Each individual die (still within the wafer) is then tested with a test probe, landing on the test pads 112 in the top metal layer. The wafer, and test pads 112, may then be cleaned, followed by application of an oxide layer 114. A thin oxide layer 114 may then be optionally formed on the top metal layer followed by singulation of dies 110 along scribe lines as illustrated in FIG. 7C. At this stage, the dies 110 can be binned into known good die (KGD1). This process is repeated for a second wafer that will supply known good die (KDG2), and so forth for additional wafers '2 . . . n'.

A carrier is then provided, and groups of known good dies 110 are then mounted on the carrier substrate 205. For example, this may be oxide bonding. In an embodiment, this may include bonding of die 110 sets (e.g. KGD1, KGD2, etc.). The process flows may differ depending upon whether the dies 110 are mounted face up, or face down on the carrier substrate.

Figure 8:
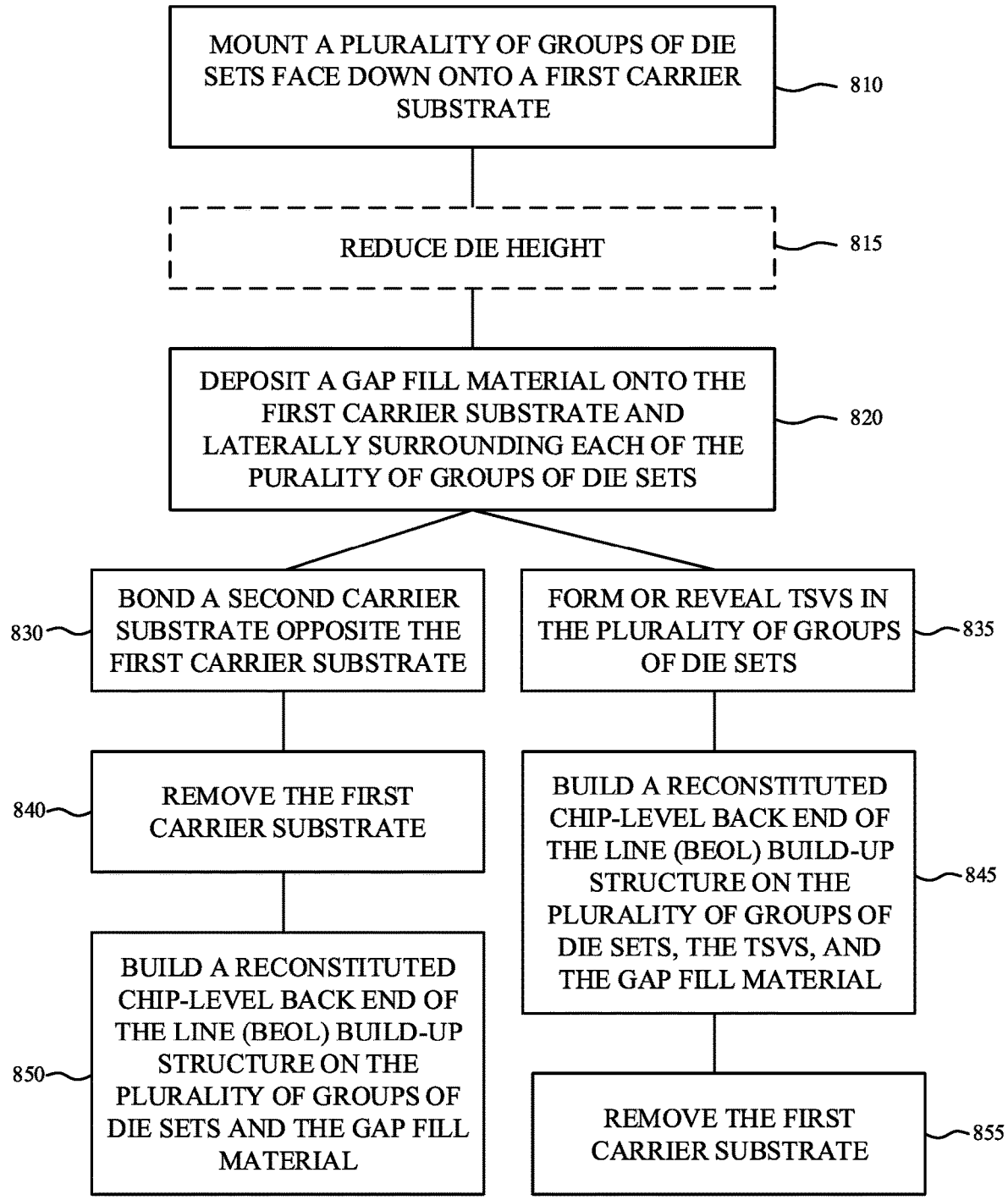
FIG. 8 is a process flow diagram of an aligned front die face-down processing sequence of a wafer reconstitution and die-stitching technique in accordance with an embodiment.

FIG. 8 is a process flow diagram of an aligned front die face-down processing sequence of a wafer reconstitution and die-stitching technique in accordance with embodiments. FIGS. 9A-9E are cross-section side view illustrations of the process flow illustrated in FIG. 8 with a front side reconstituted chip-level BEOL build-up structure in accordance with embodiments. FIGS. 9F-9K are cross-section side view illustrations of the process flow illustrated in FIG. 8 with a back side reconstituted chip-level BEOL build-up structure in accordance with embodiments. It is to be appreciated that the processing sequences of FIGS. 9A-9E and FIGS. 9F-9K are inclusive of different gap fill matrix materials (e.g. oxide, silicon, oxynitride, etc.). Additionally, several process variations are possible. In interests of clarity and conciseness the process sequences of FIG. 8, FIGS. 9A-9E and FIGS. 9F-9K as well as variations are described together.

Figure 9A:
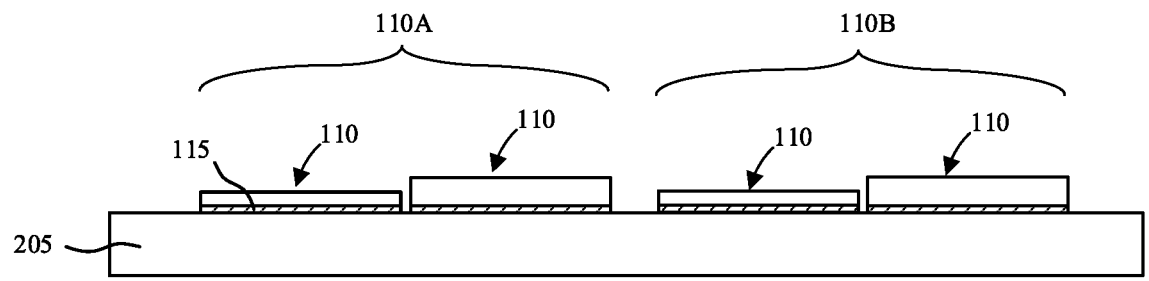
FIGS. 9A-9E are schematic cross-sectional side view illustrations of the process flow illustrated in FIG. 8 with a front side reconstituted chip-level BEOL build-up structure in accordance with an embodiment.
Figure 9B:
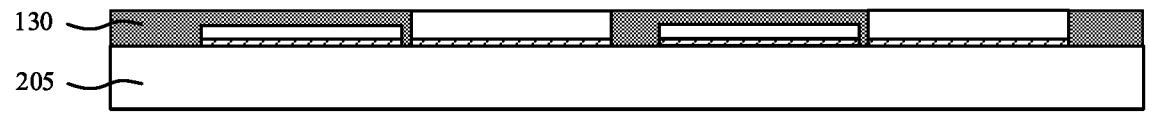
Figure 9C:
Figure 9D:
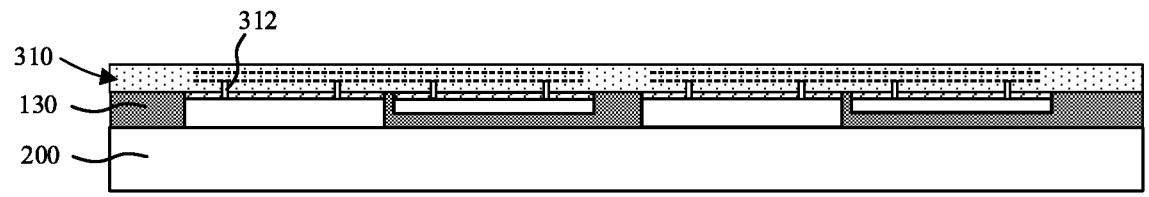
Figure 9E:
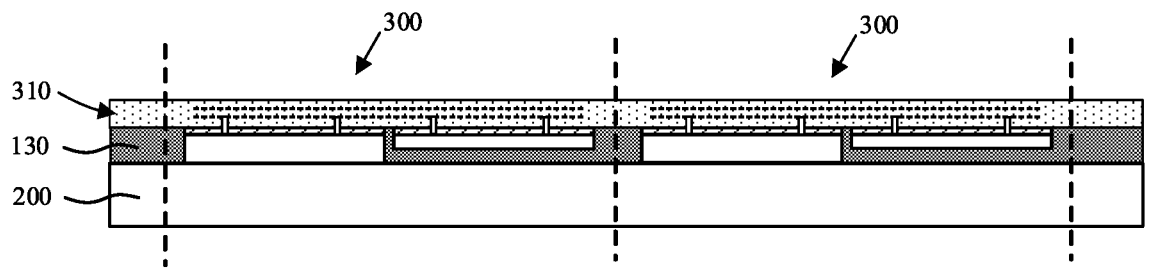
Figure 9F:
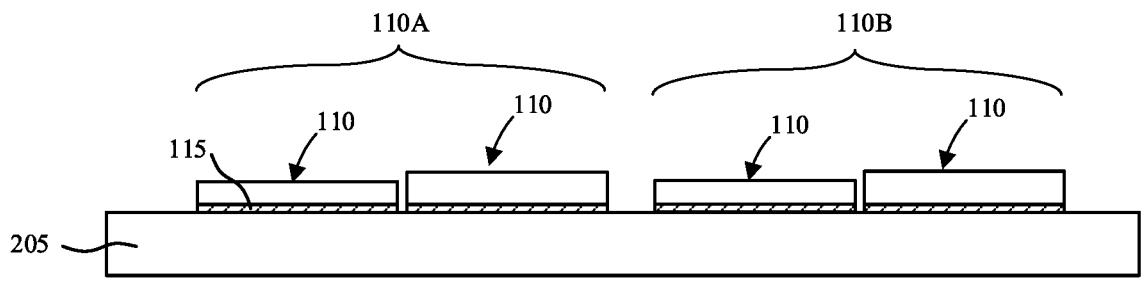
FIGS. 9F-9K are schematic cross-sectional side view illustrations of the process flow illustrated in FIG. 8 with a back side reconstituted chip-level BEOL build-up structure in accordance with an embodiment.
Figure 9G:
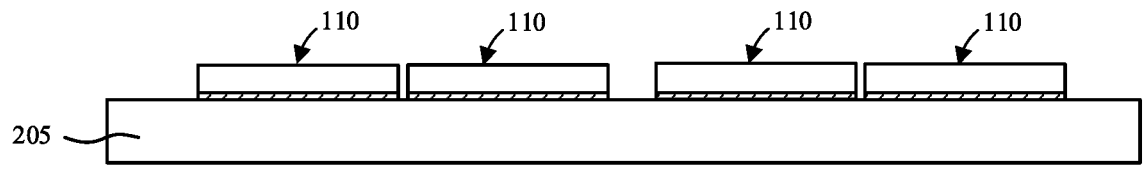

As shown in FIGS. 9A and 9F, the processing sequence can begin at operation 810 with mounting a plurality of groups of die sets 110A, 110B, etc. (including at least two dies 110) face down (active side down) onto a carrier substrate 205. Each die 110 may have a height variation. The die thicknesses may be 5-100 µm (for easier handling). The dies 110 can be oxide bonded with the carrier substrate 205. For example, oxide layer 114 may be bonded with an oxide layer on the carrier substrate 205. Incoming dies may be cleaned separately (minimum test and scribe residue). The thicker die members of the die sets can then optionally be thinned by grinding, or CMP polishing at operation 815. This is illustrated in FIG. 9G, though may also be performed after FIG. 9A. This thickness reduction of the thicker die members can facilitate subsequent gap filling and reduces the die to die height variation. Likewise, all die members can be thinned to provide equal thicknesses and remove a step surface between die member thicknesses in the die sets.

In an embodiment, prior to known good die placement (or even die dicing), the die test pads 112 (e.g. aluminum pads from testing) may be repaired and cleaned. This may be followed by deposition of extra oxide layer 114, and optionally building of vias 116 and pads 118 as described in with regard to FIG. 6.

Figure 9H:
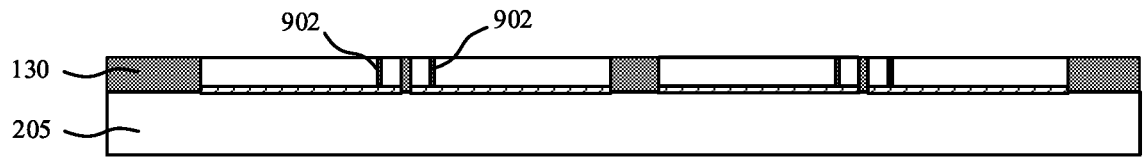

As shown in FIG. 9B and FIG. 9H, at operation 820 a gap fill 130 material is deposited on the carrier substrate 205 such that it laterally surrounds each of the plurality of groups of die sets. The gap fill 130 may then be planarized as needed, which may optionally expose the back sides of one or more die sets 110A, 110B, etc. In some embodiments the gap fill 130 material is an oxide. Where silicon is implemented (e.g. sputter, LPCVD, hot wire CVD, silicon ink, silicon paste, electro-deposition) this may allow for CTE matching with the dies 110. In such a silicon-silicon system, better mechanical matching can be achieved. Additionally, thicker dies 110 may be potentially used compared to an oxide gap fill, in which deposition may take longer.

The process sequences may then vary depending upon whether a front side or back side reconstituted chip-level BEOL build-up structure is to be performed. In a front side approach, at operation 830 a second (back) carrier substrate 200 can then be bonded opposite the first (front) carrier substrate 205, followed by removal of the first carrier substrate 205 at operation 840 and as illustrated in FIG. 9C. At this point the die 110 faces (active side) are on the exposed side. Referring now to FIG. 9D, the structure is flipped and at operation 850 a reconstituted chip-level BEOL build-up structure 310 is built on the plurality of groups of die sets and the gap fill 130 material. This is different from CoW sequences described because the reconstituted chip-level BEOL build-up structure 310 does not need to be hybrid bonded, and instead can be formed in a layer by layer processing sequence including polymers/metal or oxide/metal, for example. The individual reconstituted chip-level BEOL build-up structure routings can be tested, followed by dicing for chip singulation as shown in FIG. 9E. The processing sequence illustrated in FIGS. 9A-9E may allow for die 110 height variation since the active sides are facing out for the processing sequences.

Figure 9I:
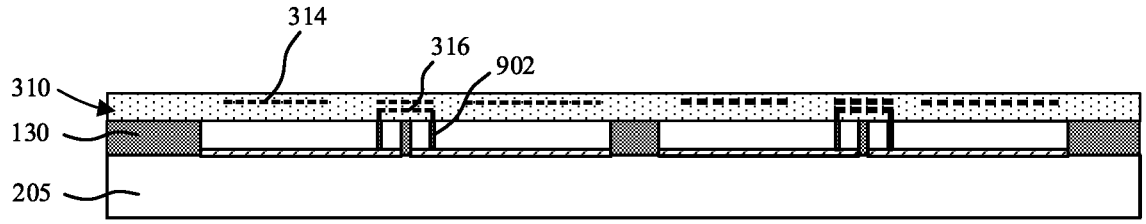
Figure 9J:
Figure 9K:
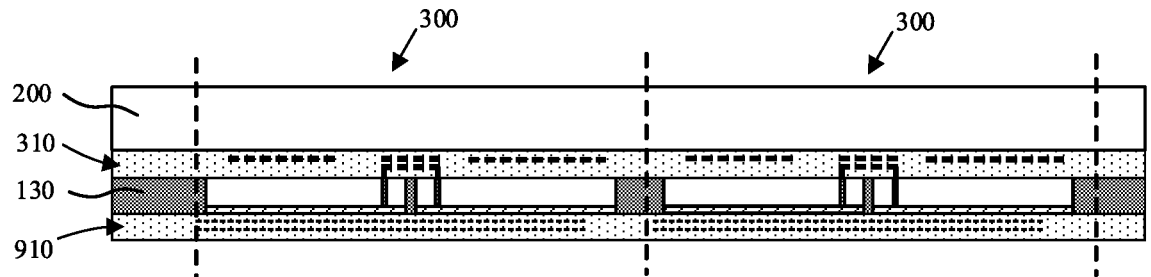

In a back side D2D interconnect approach, at operation 835 through silicon vias (TSVs) 902 can then be formed in the plurality of groups of die sets, or revealed (e.g. preformed TSVs are revealed). At this point the die 110 faces (active side) are still facing down, and at operation 845 a reconstituted chip-level BEOL build-up structure 310 is built on the back sides of the plurality of groups of die sets, TSVs 902, and the gap fill 130 material as illustrated in FIG. 9I. The reconstituted chip-level BEOL build-up structure 310 may include the D2D interconnects 316, on-chip (intra-chip) wiring 314, and one or more dielectric layers as previously described. Thus, the back side reconstituted chip-level BEOL build-up structure 310 include the D2D connections through TSVs 902. A second (back) carrier substrate 200 can then be bonded opposite the first (front) carrier substrate 205, followed by removal of the first carrier substrate 205 at operation 855 and as illustrated in FIG. 9J. At this point the die 110 faces (active side) are on the exposed side that can be used to connect to the package. Referring now to FIG. 9K, an additional front side reconstituted chip-level BEOL build-up structure 910 can optionally be built on the plurality of groups of die sets and the gap fill 130 material, and more specifically on the die-level BEOL build-up structures 115. This structure may be followed by singulation and removal of carrier substrate 200, application of bumps 140, additional WoW bonding, etc. The front side reconstituted chip-level BEOL build-up structure 910 may be substantially similar to reconstituted chip-level BEOL build-up structures 115, 310 previously described and include the same features.

Figure 10:
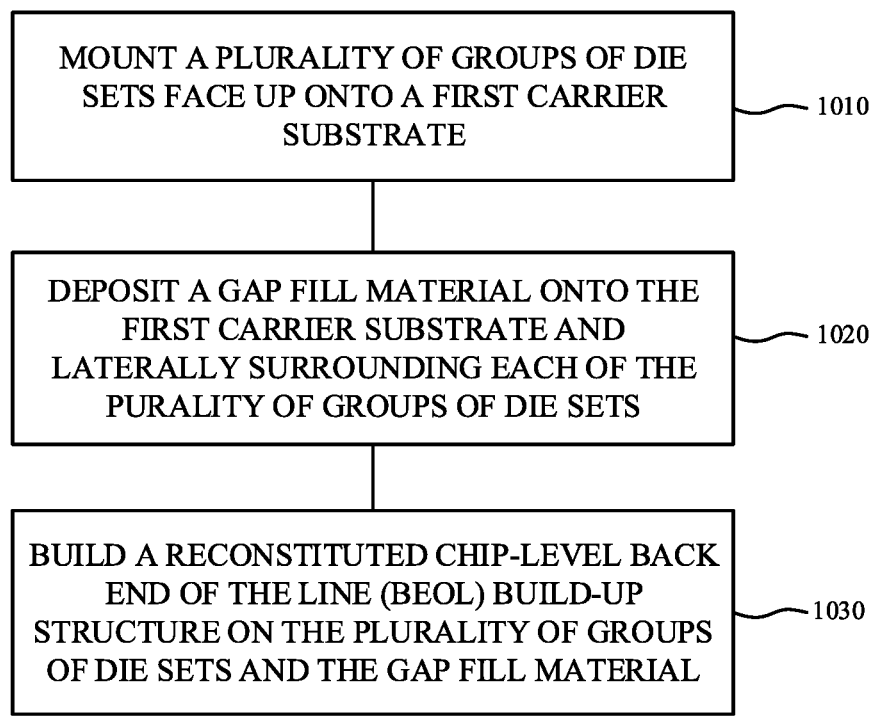
FIG. 10 is a process flow diagram of an aligned front die face-up processing sequence of a wafer reconstitution and die-stitching technique in accordance with an embodiment.

FIG. 10 is a process flow diagram of an aligned front die face-up processing sequence of a wafer reconstitution and die-stitching technique in accordance with embodiments. FIGS. 11A-11D are cross-section side view illustrations of the process flow illustrated in FIG. 10 in accordance with embodiments.

It is to be appreciated that the processing sequence of FIGS. 11A-11D is inclusive of different gap fill matrix materials (e.g. oxide, silicon). Additionally, several process variations are possible. In interests of clarity and conciseness the process sequences of FIG. 10 and FIGS. 11A-11D as well as variations are described together.

Figure 11A:
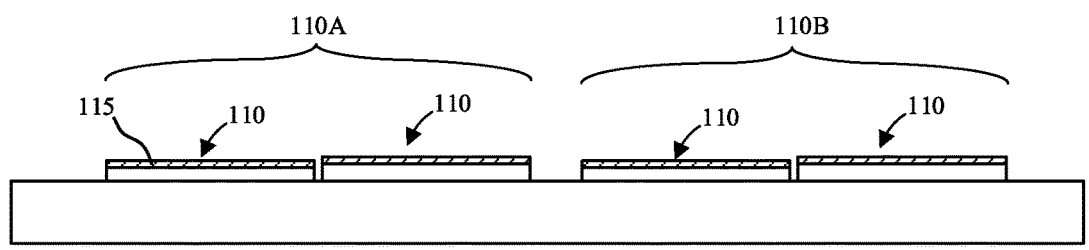
FIGS. 11A-11D are schematic cross-sectional side view illustrations of the process flow illustrated in FIG. 10 in accordance with an embodiment.
Figure 11B:
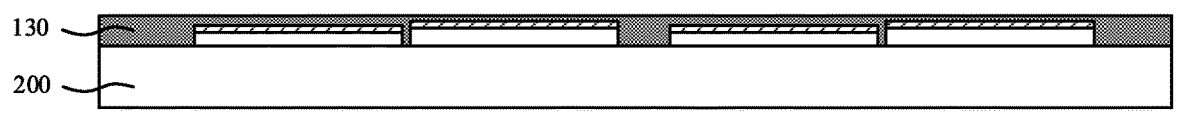
Figure 11C:
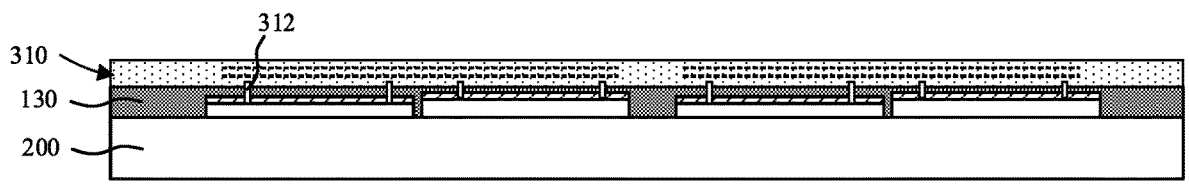

As shown in FIG. 11A, the processing sequence can begin at operation 1010 with mounting a plurality of groups of die sets (including at least two dies 110) face up (active side up) onto a carrier substrate 200. Each die 110 may have a small height variation. For example only, variation may be +/−1 μm, with thickness of each die being 5-20 μm. Thickness variation may be less than that of FIG. 9A. The dies 110 can be oxide bonded with the carrier substrate 200, for example. Incoming dies may be cleaned separately (minimum test and scribe residue). As shown in FIG. 11B at operation 1020 a gap fill 130 material is deposited onto the carrier substrate 205 such that it laterally surrounds each of the plurality of groups of die sets. The gap fill 130 may then be planarized as needed. Referring now to FIG. 11C, at operation 1030 a reconstituted chip-level BEOL build-up structure 310 is built on the plurality of groups of die sets 110A, 110B, etc. and the gap fill 130 material. This is different from CoW sequences described because the reconstituted chip-level BEOL build-up structure does not need to be hybrid bonded, and instead can be formed in a layer by layer processing sequence including polymers/metal or oxide/metal, for example. Formation of the reconstituted chip-level BEOL build-up structure 310 may include formation of vias 312, which can extend through the gap fill 130 material. Since active sides are facing up, via 312 height to the dies 110 needs to be sufficient to contact the die-level BEOL build-up structures 115. For example, this may be greater than die 110 height variation. After planarizing, vias 312 may be exposed (at least on one of the dies, perhaps not all if different thicknesses). The remainder of the reconstituted chip-level BEOL build-up structure 310 may then be formed. In some embodiments the gap fill 130 material is an oxide. Where silicon is implemented (e.g. sputter, CVD, PECVD, LPCVD, hot wire CVD, silicon ink, silicon paste, electro-deposition) this may allow for conformal, low temperature deposition and CTE matching with the dies as previously described.

Figure 11D:
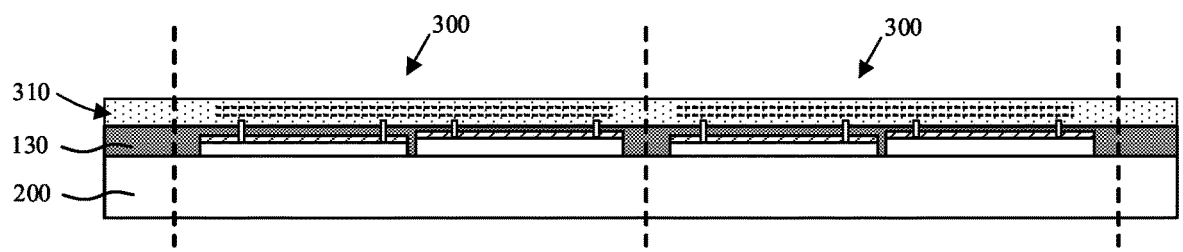

The individual reconstituted chip-level BEOL routings can then be tested, followed by dicing for chip 300 singulation as shown in FIG. 11D. The processing sequence illustrated in FIGS. 11A-11D may be a less expensive processing sequence option. An additional processing sequence variation is also described and illustrated with regard to FIGS. 17A-17E which may further reduce processing costs.

The wafer reconstitution and die-stitching techniques in accordance with embodiments may also provide particle sensitivity reduction compared to CoW hybrid bonding. FIG. 12A is a schematic cross-sectional side view illustration showing a particle 1200 during wafer reconstitution phase and hybrid bonding of a CoW process. Planarity requirements can be strict (such as a root mean square (RMS) roughness of approximately 1-5 nm), and even small particles (e.g. with maximum particle size of 10 nm) can open a large number of pads 118, 122, with potential yield impact. Thus, particle size and planarity requirements are tightly linked, and needs a very clean environment for assembly, which can be expensive. As a corollary, a 10 nm particle size control may need a technology node cleanliness better than 20 nm, with implications to setup and operating costs. FIG. 12B is a schematic top view illustration showing particle sensitivity on a CoW hybrid bonding process. As shown, pad 118, 122 connections between die 110 and interposer 120 may be coarser features (e.g. power, ground pads, etc.) compared to the finer pads 118, 122 and features/wiring in the die-to-die interconnects 125. As shown, particles 1200 can cause yield loss in any of these areas, and particle sensitivity is over 100% of the hybrid bond area, even though the fine features in the smaller area (e.g. 10% of overall).

Figure 13A:
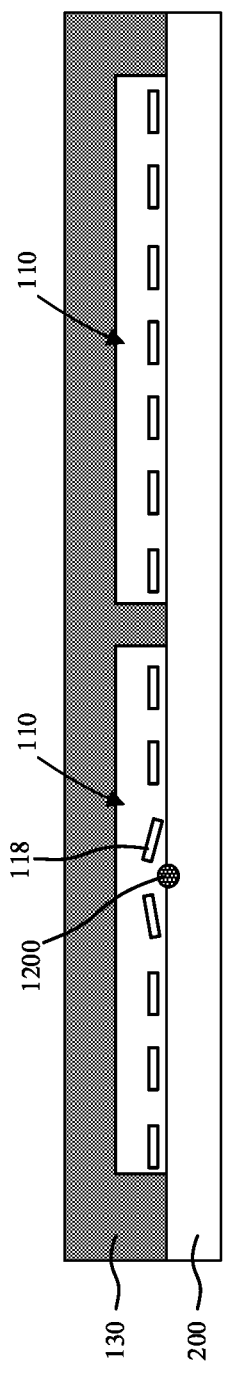
FIG. 13A is a schematic cross-sectional side view illustration showing less particle sensitivity during a wafer reconstitution phase of a wafer reconstitution and die-stitching technique process in accordance with an embodiment.
Figure 13B:
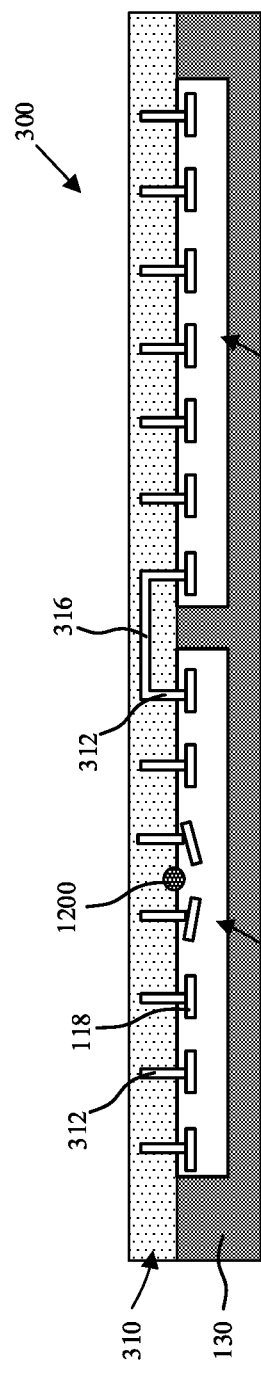
FIG. 13B is a schematic cross-sectional side view illustration showing a particle during interconnection phase of a wafer reconstitution and die-stitching technique process in accordance with an embodiment.
Figure 13C:
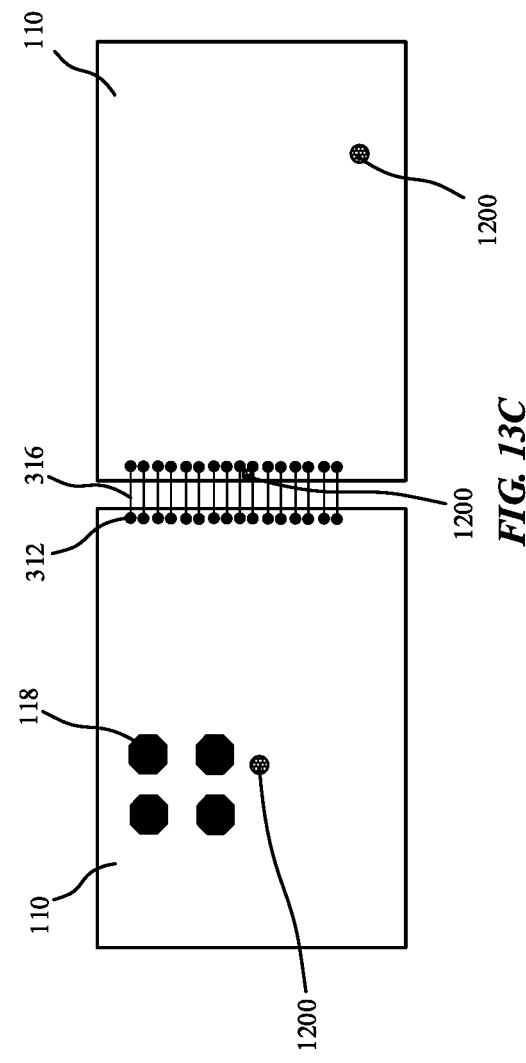
FIG. 13C is a schematic top view illustration showing particle effect on a wafer reconstitution and die-stitching technique process in accordance with an embodiment.

FIG. 13A is a schematic cross-sectional side view illustration showing less particle 1200 sensitivity during wafer reconstitution phase of a wafer reconstitution and die-stitching technique process in accordance with an embodiment. FIG. 13B is a schematic cross-sectional side view illustration showing a particle 1200 during interconnection phase of a wafer reconstitution and die-stitching technique process in accordance with an embodiment. As shown in FIGS. 13A-13B, via 312 height over-etch can be used to compensate for defects (particles). Exemplary pad 118 pitch of approximately 10 μm, and D2D interconnect 316 pitch of approximately 1 μm may be much larger than the particle (e.g. approximately 100 nm). This is 10× larger than the CoW case. Thus, wafer reconstitution and die-stitching techniques in accordance with embodiments can reduce particle size sensitivity by selecting physical/process dimensions. This can lead to a more relaxed cleanliness and assembly options. As a corollary, a 100 nm particle size control needs a technology node cleanliness better than 200 nm (a very mature technology node). FIG. 13C is a schematic top view illustration showing particle 1200 effect on a wafer reconstitution and die-stitching technique process in accordance with an embodiment. Similar to FIG. 12B, pad 118 connections between the dies 110 and the reconstituted chip-level BEOL build-up structure 310 may be coarser features (e.g. power, ground pads, etc.) compared to the finer pad 118, via 312 and features/wiring in the D2D interconnects 316. As shown, particle sensitivity is largely limited to the fine pitch area (e.g. 10% overall), which can improve yield. Due to coarser feature sizes, the particles over the other die areas have much less impact on yield. Furthermore, by making the features sizes in the D2D interconnect 316 areas larger, fail probability can be further lowered.

The reconstituted chip-level BEOL build-up structure 310 interconnections used for die stitching may implement suitable conductive materials and BEOL processing techniques. In some embodiments, either copper wiring and/or aluminum wiring may be utilized when forming the reconstituted chip-level BEOL build-up structure 310 with the wafer reconstitution and die-stitching techniques. For example, aluminum wiring may be more amenable to a very mature BEOL manufacturing line that does not support a copper BEOL process. Some very mature process and manufacturing lines only support aluminum. Aluminum process may be sufficient for some applications, and cheaper than copper. In more traditional aluminum interconnections, aluminum wiring is combined with tungsten plugs for multi-layer fine pitch options (usually as lower metal layer close to silicon). Tungsten process adds expense, as does aluminum metal layer definition. Conversely, copper dual damascene process can be expensive due to the cost of barrier and cap layers to prevent copper diffusion. In an embodiment, the BEOL interconnections include aluminum dual damascene connections. Aluminum dual damascene may optionally include reflow for planarization and filling purposes, which could exceed 450° C. In some embodiments with such an electrodeposited aluminum dual damascene embodiment, there is no tungsten via, and no reflow. This enables a fine metal pitch because of smoother topography.

Figure 14A:
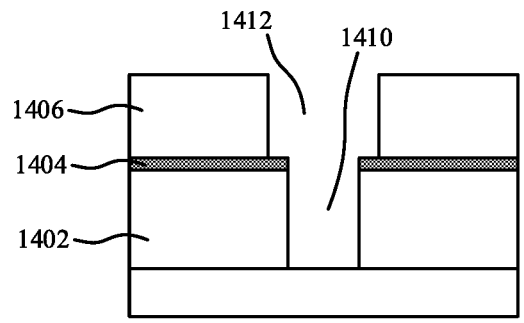
FIGS. 14A-14C are schematic cross-sectional side view illustrations of an aluminum dual damascene process in accordance with an embodiment.
Figure 14B:
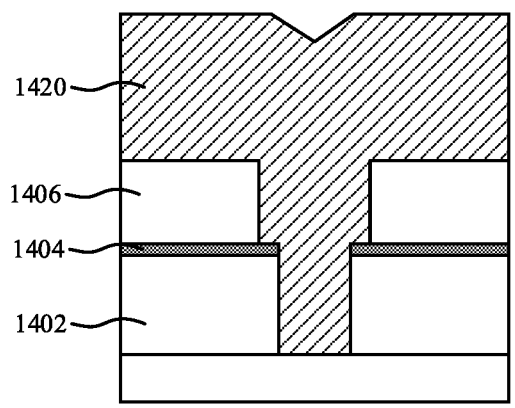
Figure 14C:
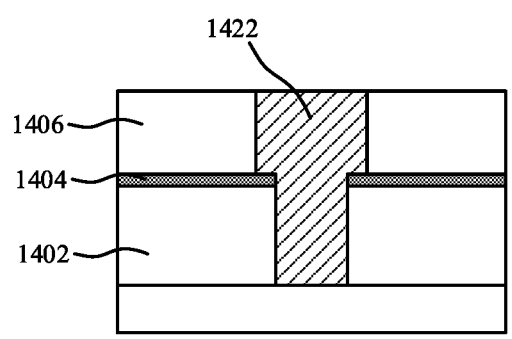

FIGS. 14A-14C are schematic cross-sectional side view illustrations of an aluminum dual damascene process in accordance with an embodiment. As illustrated, in FIG. 14A the sequence can include a first dielectric layer 1402 and second dielectric layer 1406 separated by an etch stop layer 1204. A via 1210 opening and trench 1412 opening may be formed using either a via first or via last approach. As shown in FIG. 14B, a bulk aluminum layer 1420 is deposited to fill the via 1410 opening and trench 1412 opening. This may be followed by a reflow process, and planarization resulting in the dual damascene interconnect 1422 as illustrated in FIG. 14C.

Figure 15A:
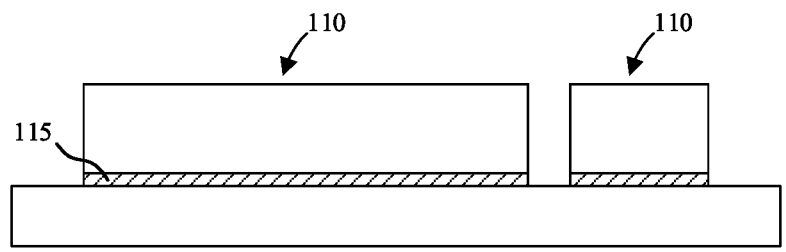
FIGS. 15A-15D are schematic cross-sectional side view illustrations of a gap fill deposition sequence in accordance with an embodiment.
Figure 15B:
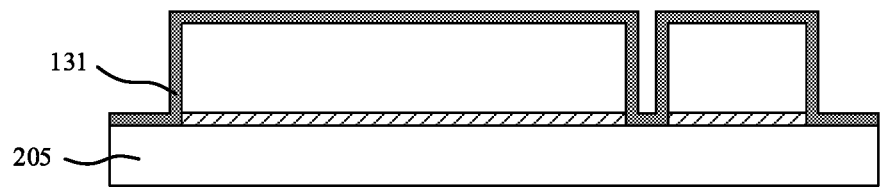
Figure 15C:
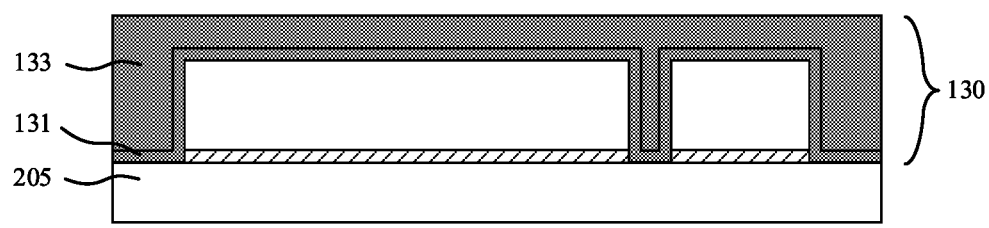
Figure 15D:
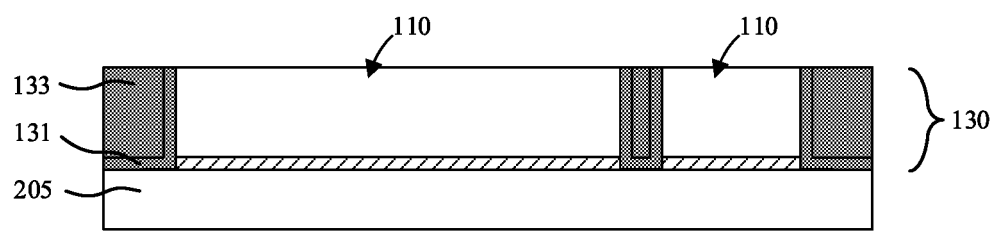

FIGS. 15A-15D are schematic cross-sectional side view illustrations of a gap fill deposition sequence in accordance with embodiments. In the particular sequence illustrated, the die 110 sets are mounted face down onto a carrier substrate 205 as previously described and illustrated with regard to FIG. 9A, however, embodiments are not so limited, and the gap fill deposition sequence may be performed with die 110 sets mounted face up as illustrated in FIG. 11A. A first conformal layer 131 may then be formed as illustrated in FIG. 15B. For example, this may be thin oxide, nitride, silicon layer etc. to provide good step coverage. In an embodiment, the first conformal layer 131 is formed using a higher quality, and slower deposition method such as high temperature CVD processes, which may result in epitaxial growth. A bulk layer 133 may then be deposited as illustrated in FIG. 15C. The bulk layer 133 may be formed using a process that results in a lower quality material (e.g. more defects), and at deposited at a higher rate. The gap fill 130 may then be planarized as illustrated in FIG. 15D, which may optionally expose the back sides of the dies 110.

Figure 15E:
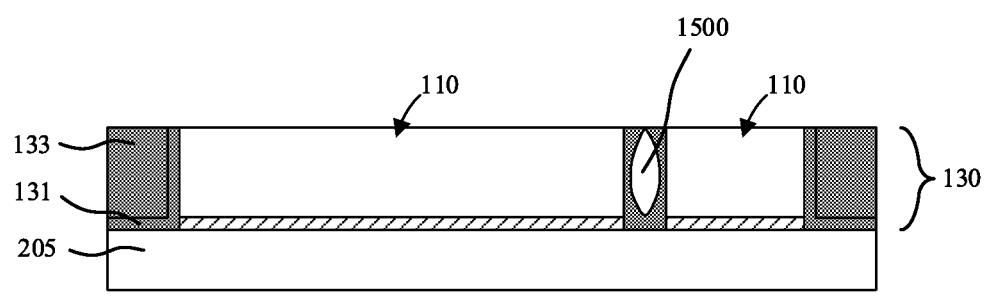
FIG. 15E is a schematic cross-sectional side view illustration of a gap fill with air gap in accordance with an embodiment.
Figure 15F:
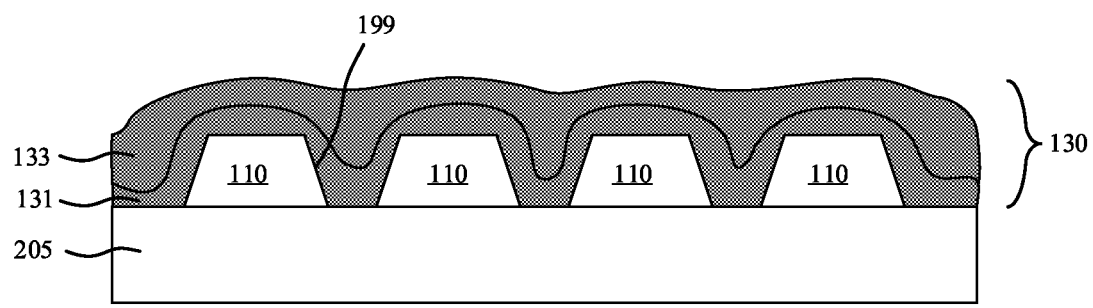
FIG. 15F is a schematic cross-sectional side view illustration of a gap fill material between dies with tapered sidewalls in accordance with an embodiment.

The gap fill 130 material may be formed of multiple layers and may include multiple layers of different materials in accordance with embodiments. While a first conformal layer 131 and bulk layer 133 are illustrated in FIG. 15D, the gap fill 130 may include multiple conformal layers, and other layer stacks. In an embodiment illustrated in FIG. 15E, growth properties of the gap fill 130 layers may result in an air gap 1500 between die 110 sets. For example, an air gap may contribute dielectric properties to the resultant chip structure.

Selection of appropriate gap fill 130 deposition technique may additionally consider aspect ratios of die height to gap between the die sets. In accordance with embodiments the gap between adjacent dies 110 in a die set is characterized by an aspect ratio of approximately 1 or higher such as 1-2, or even as high as 5, though higher aspect ratios are possible. For an exemplary aspect ratio of 5, the dies 110 may have a minimum die height of 10 μm, with gap of 2 μm. Yet, lower aspect ratios may be easier to fill, with reduced time requirements. In an embodiment illustrated in FIG. 15E, the die 110 sidewalls 199 may be tapered to facilitate gap fill.

Figure 16A:
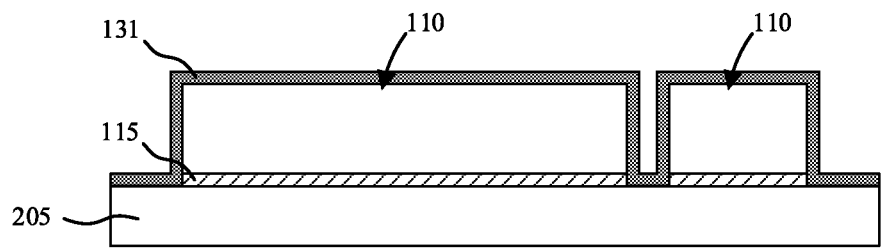
FIGS. 16A-16D are schematic cross-sectional side view illustrations of a gap fill deposition sequence including silicon ink or paste deposition in accordance with an embodiment.
Figure 16B:
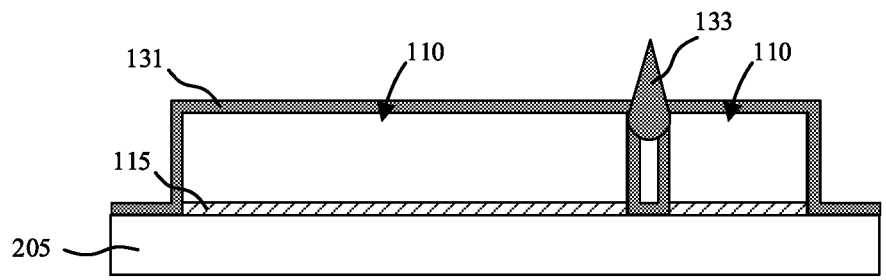
Figure 16C:
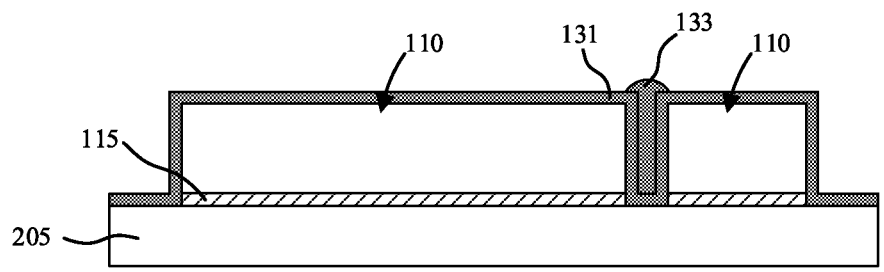
Figure 16D:
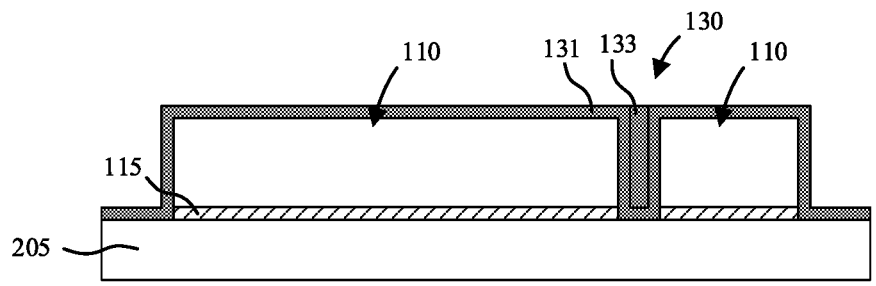

FIGS. 16A-16D are schematic cross-sectional side view illustrations of a gap fill deposition sequence including silicon ink or paste deposition in accordance with embodiments. As illustrated, the sequence may begin similarly as with FIG. 15A with the optional deposition of a first conformal layer 131. For example, this may be a PECVD epitaxial deposition process of silicon. Alternatively, an oxide or nitride layer may be deposited. This first conformal layer 131 forms a high quality gap fill seal. Referring to FIGS. 16B-16C, a bulk layer 133 of silicon ink or paste can be deposited followed by reflow. For example, reflow may occur at temperature of less than 350° C. The low reflow temperature may be the result of the size and shape of silicon nanocrystals with the ink or paste. For example, the silicon nanocrystals may have a maximum width of less than 4 nm. The gap fill 130 may then be planarized as illustrated in FIG. 16D, which may optionally expose the back sides of the dies 110.

Silicon ink or pastes may additionally be used for mechanical die leveling in accordance with embodiments. FIGS. 17A-17E are schematic cross-sectional side view illustration of an aligned front die face-up processing sequence of a wafer reconstitution and die-stitching technique with mechanical leveling in accordance with embodiments. In particular, the sequence illustrated in FIGS. 17A-17E is a modification to the face up sequence illustrated in FIGS. 11A-11C in which a moldable layer is deposited which is used to flatten the top surface topography of the dies 110 prior to formation of the gap fill 130 material. This allowed for the formation of a reconstituted chip-level BEOL build-up structure 310 where via 312 height does not need to be different for dies 110 of different height. This sequence also allows for a single carrier substrate processing sequence, as opposed to the face down processing sequence of FIGS. 9A-9E that utilizes two carrier substrates.

Figure 17A:
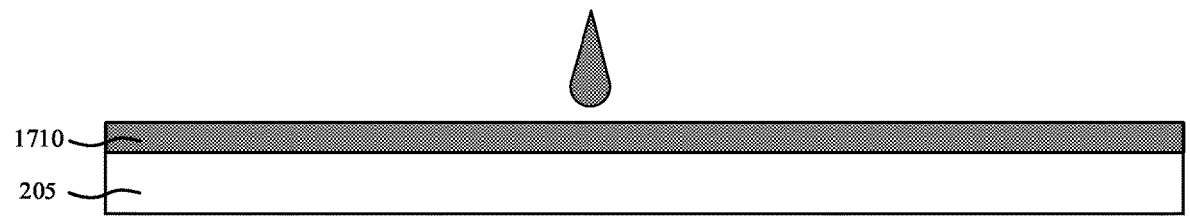
FIGS. 17A-17E are schematic cross-sectional side view illustration of an aligned front die face-up processing sequence of a wafer reconstitution and die-stitching technique with mechanical leveling in accordance with an embodiment.
Figure 17B:
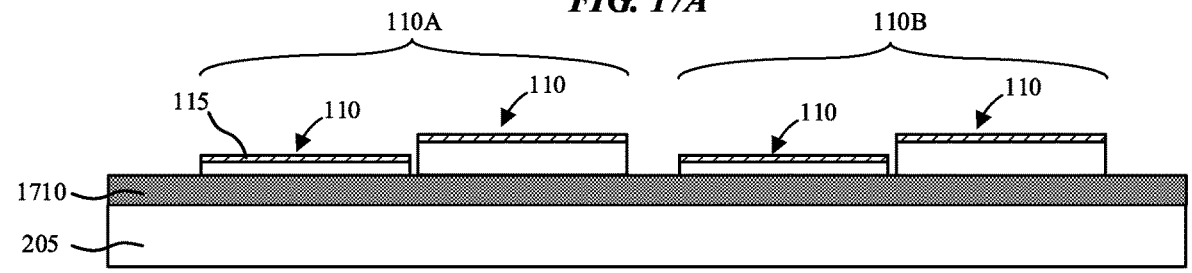
Figure 17C:
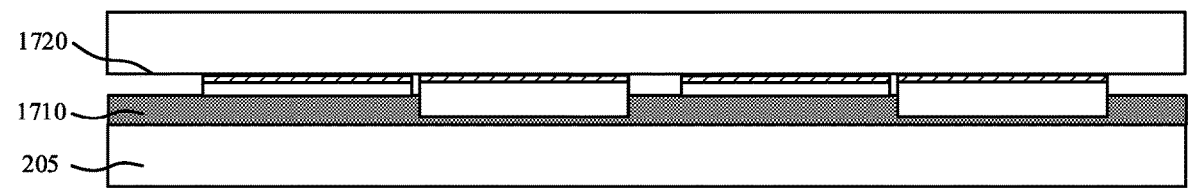
Figure 17D:
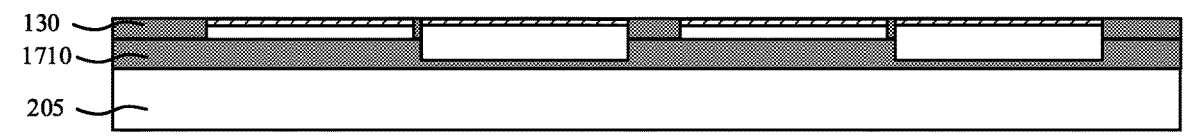
Figure 17E:
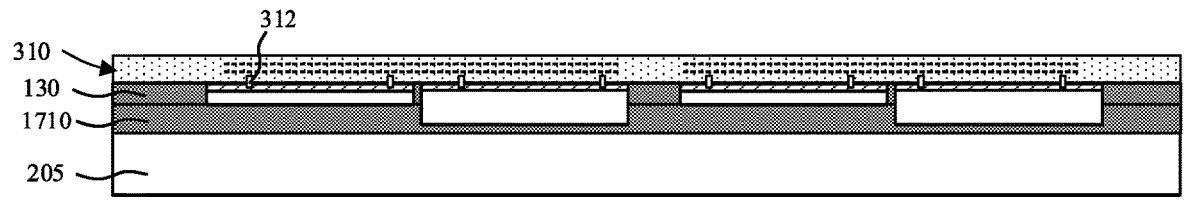

As illustrated, the sequence may begin with the deposition of a moldable layer 1710. For example, this may be a silicon ink or paste, which may behave as a silicon solder. The die 110 sets are then placed onto the moldable layer 1710 as shown in FIG. 17B, followed by the flattening with a plane surface 1720. As shown in FIG. 17C, the top surfaces of the dies 110 are now level, and the bottom surfaces sink into the moldable layer 1710. Heat may then be applied to set the moldable layer 1710 resulting in the die being attached to the carrier substrate by moldable layer 1710. This may then be followed by formation of the gap fill 130 material, followed by a reconstituted chip-level BEOL build-up structure 310 as illustrated in FIGS. 17D-17E.

Figure 18A:
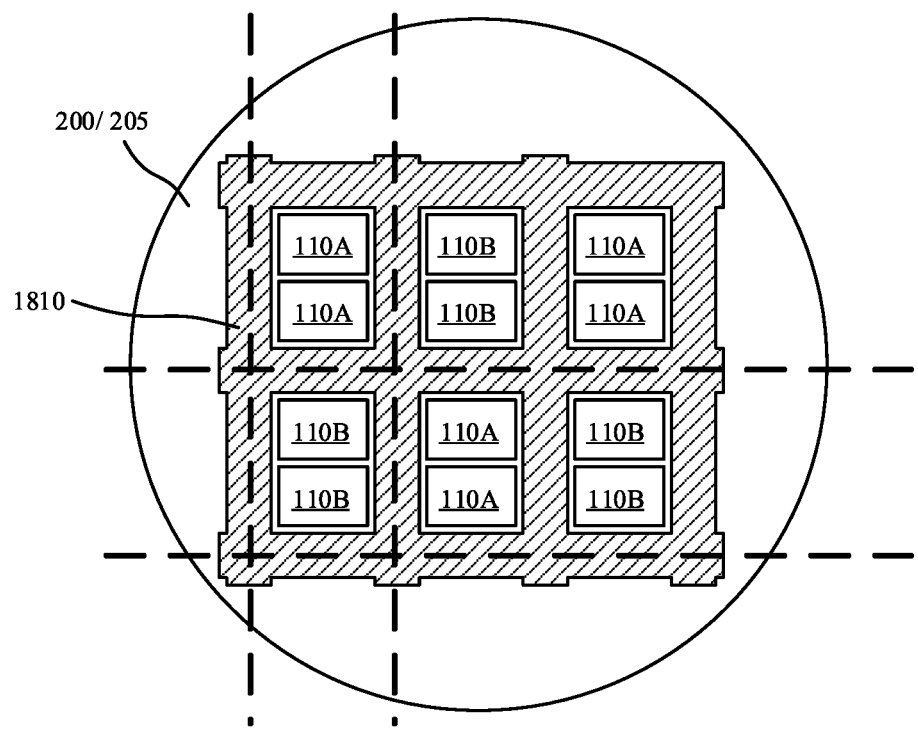
FIG. 18A is a schematic top view illustration of a dummy structure between die sets to maintain aspect ratios around the die sets in accordance with an embodiment.
Figure 18B:
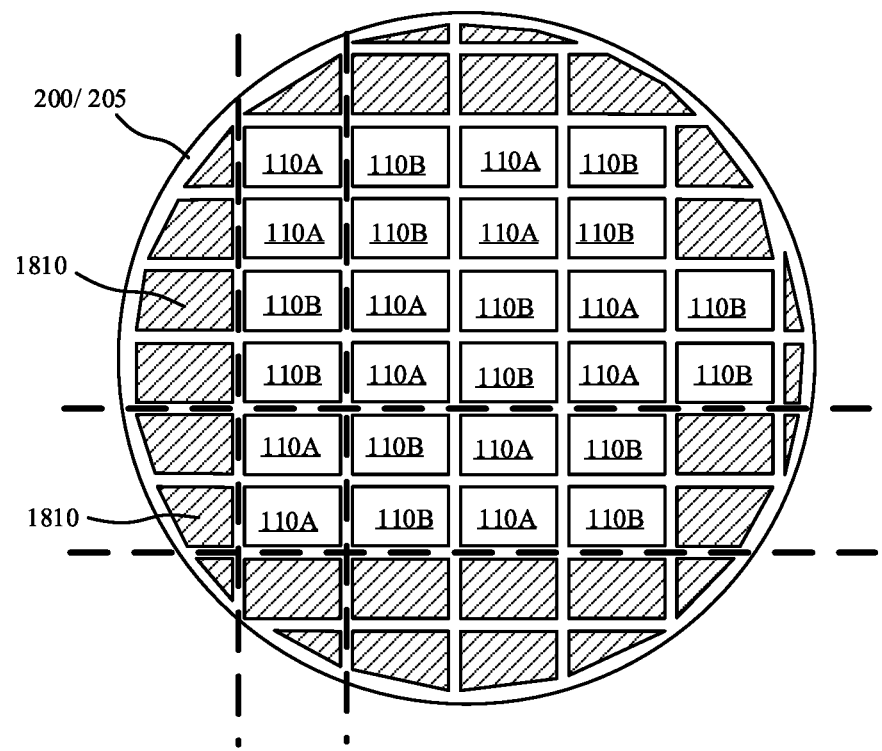
FIG. 18B is a schematic top view illustration of a dummy structure around die sets to maintain aspect ratios around carrier substrate edges in accordance with an embodiment.

Until this point deposition of the gap fill 130 material and aspect ratio between die 110 sets has been described without regard to carrier substrate (wafer) edges, or scribing of die sets. In an embodiment illustrated in FIG. 18A a dummy structure 1810 is formed between die sets to maintain the aspect ratios of the gaps around the die sets 110A, 110B, etc. For example, such a configuration may be utilized when scribe lines (illustrated by dashed lines) are wider than the gaps between the dies 110 within a die set 110A, 110B, etc. FIG. 18B is an illustration of dummy structures 1810 formed around the carrier substrate (wafer) edges so that gap filling, and aspect ratios are maintained for the dies 110 near the edges.

Figure 19:
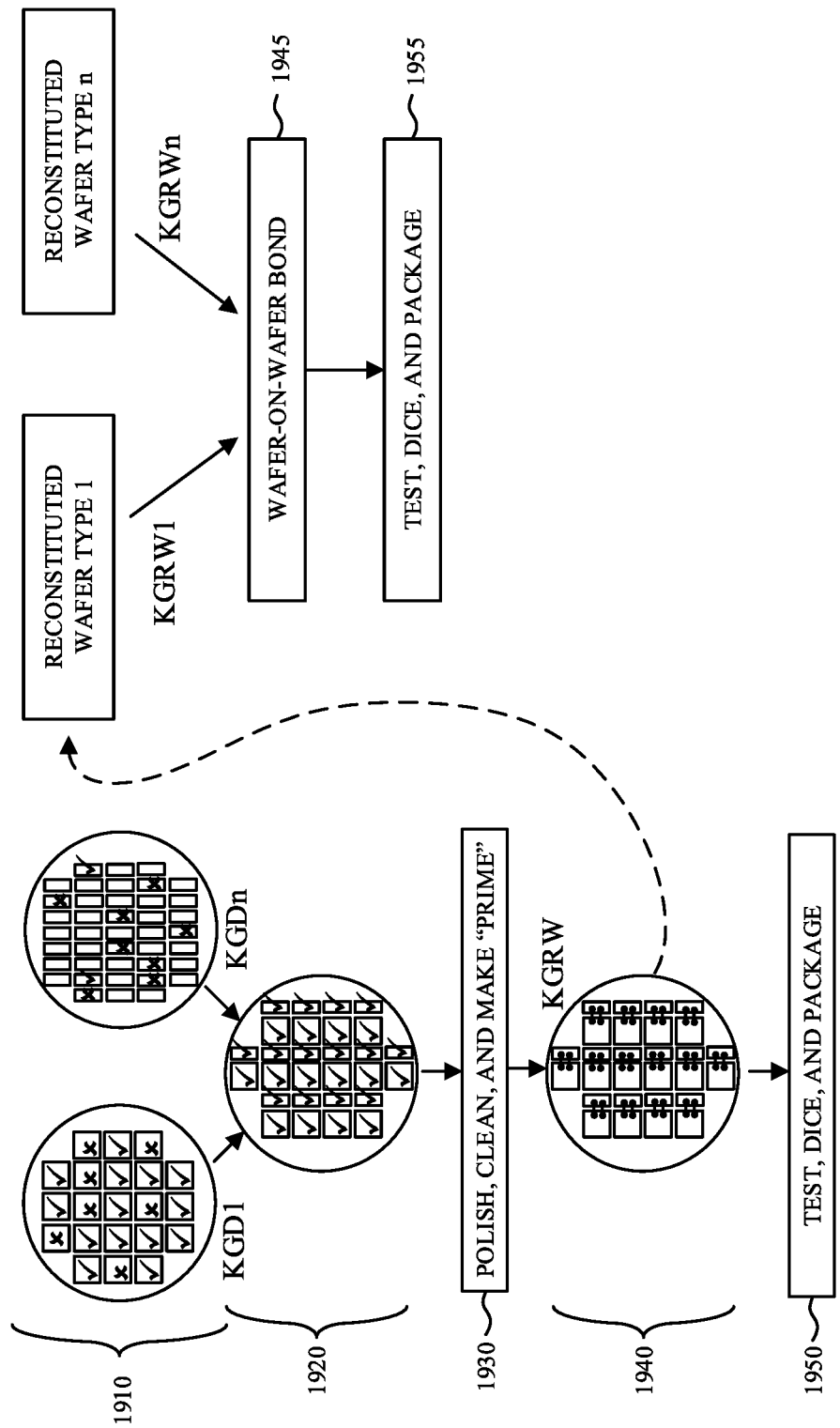
FIG. 19 is a flow chart of a wafer reconstitution flow in accordance with an embodiment.

Referring now to FIG. 19, a high-level flow chart of a wafer reconstitution flow is provided in accordance with embodiments. As shown, at operation 1910 a plurality of wafers (1 . . . n) are processed to determine known good die KGD1 . . . KGDn, with acceptable dies 110 indicated with check-marks and defective dies 110 indicated with x-marks. The known good die sets are then reconstituted onto a wafer (e.g. FIGS. 9A-9C; 11A-11B; 17A-17D) at operation 1920. The known good dies may then be polished, cleaned and made "prime" at operation 1930. A mature fab process may be utilized for this sequence, with no (or few) new line required. The fab sequence may also be re-formatted to a 200 mm or 300 mm wafer line, or a larger panel line such as 500×500 mm.

The known good reconstituted wafer (KGRW) can then be re-introduced into the fab for reconstituted chip-level BEOL processing and D2D interconnection (e.g. FIGS. 9D; 11C; 17E) at operation 1940. This is followed by testing, dicing and final packaging at operation 1950.

Alternatively, rather than testing and dicing at this point, the KGRWs with a reconstituted chip-level BEOL build-up structures can be bonded for 3D wafer on wafer (WoW) packaging. In the illustrated case KGRW1 and KGRWn are bonded at operation 1945 with a wafer on wafer bond, followed by dicing and final packaging at operation 1955 for a 3D packaging solution.

Figure 20:
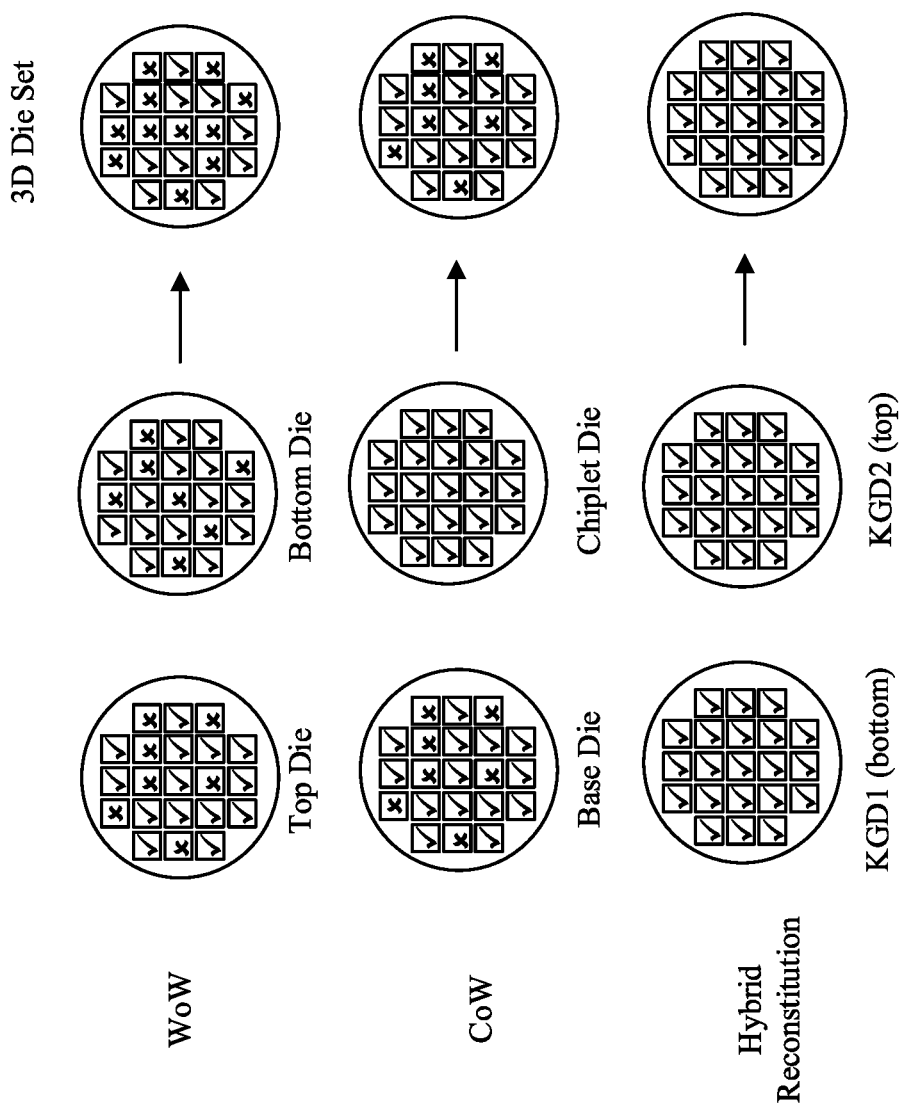
FIG. 20 is a flow chart comparing yield considerations of wafer on wafer, chip on wafer, and a hybrid process flow of wafer reconstitution and die-stitching technique in accordance with an embodiment.

FIG. 20 is a flow chart comparing yield considerations of wafer on wafer, chip on wafer, and a hybrid process flow of wafer reconstitution and die-stitching technique in accordance with embodiments. As illustrated, the x-marks indicate defective dies, while check-marks indicate acceptable dies after testing. As shown, in the WoW technique, active dies are wasted. Both the bottom and top die have to yield. Process cost is wasted on non-yielding die. For a CoW technique active die are saved. Process cost is wasted on non-yielding portions of the base wafer. In a hybrid approach which uses a KGD1 bottom wafer and KDG2 top wafer both base and top wafer yields are improved. Process cost is lower as both top and bottom die have high yielding dies. Thus, the reconstituted wafers in accordance with embodiments can be used in wafer on wafer techniques (surface, alignment, TSV, bonding preparation) for the fabrication of 3D reconstituted chips.

In utilizing the various aspects of the embodiments, it would become apparent to one skilled in the art that combinations or variations of the above embodiments are possible for forming a chip with a wafer reconstitution and die-stitching technique. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A chip comprising:
   a reconstituted chip-level back end of the line (BEOL) build-up structure including a plurality of interconnects;
   a die set including a first die and a second die on the reconstituted chip-level BEOL build-up structure, wherein the first die includes a first die-level BEOL build-up structure including damascene interconnects, and the second die includes a second die-level BEOL build-up structure including damascene interconnects; and
   an inorganic gap fill material on the reconstituted chip-level BEOL build-up structure and surrounding the die set, wherein the inorganic gap fill material includes a silicon matrix.

2. The chip of claim 1, wherein the reconstituted chip-level BEOL build-up structure includes damascene interconnects.

3. The chip of claim 2, wherein the reconstituted chip-level BEOL build-up structure includes aluminum damascene interconnects.

4. The chip of claim 2, wherein the reconstituted chip-level BEOL build-up structure includes die-to-die interconnections between the die set.

5. A chip comprising:
   a reconstituted chip-level back end of the line (BEOL) build-up structure including a plurality of interconnects;
   a die set on the reconstituted chip-level BEOL build-up structure; wherein the die set includes a first die and a second die, the first die includes a first die-level BEOL build-up structure, and the second die includes a second die-level BEOL build-up structure;
   an inorganic gap fill material on the reconstituted chip-level BEOL build-up structure and surrounding the die set;
   wherein the reconstituted chip-level BEOL build-up structure includes deep vias that connect to the first die-level BEOL build-up structure, and extend below test pads in the first die-level BEOL build-up structure.

6. The chip of claim 5, wherein the reconstituted chip-level BEOL build-up structure includes intra-die interconnections for the first die, intra-die interconnections for the second die, and die-to-die interconnections between the first die and the second die.

7. The chip of claim 6, wherein the die-to-die interconnections between first die and second die do not include ESD protection circuits.

8. The chip of claim 7, wherein the reconstituted chip-level BEOL build-up structure includes ESD protection circuits connected to external reconstituted chip-level contact pads.

9. The chip of claim 6, wherein the inorganic gap fill material includes a silicon matrix.

10. A method of fabricating a reconstituted wafer comprising:
    mounting a plurality of groups of die sets face down onto a first carrier substrate;
    depositing a gap fill material onto the first carrier substrate and laterally surrounding each die of the plurality of groups of die sets;
    bonding a second carrier substrate opposite the first carrier substrate;
    removing the first carrier substrate; and
    building a reconstituted chip-level back end of the line (BEOL) build-up structure on back sides of the plurality of groups of die sets and in contact with a plurality of TSVs in the plurality of groups of die sets, after depositing the gap fill material and prior to bonding the second carrier substrate opposite the first carrier substrate.

11. The method of claim 10, wherein the gap fill material is an oxide or oxynitride material.

12. The method of claim 10, wherein the gap fill material comprises a silicon matrix.

13. The method of claim 10, further comprising reducing a thickness of at least thicker die members of the die sets prior to depositing the gap fill material.

14. The method of claim 10, further comprising forming a plurality of TSVs in the plurality of groups of die sets after depositing the gap fill material.

15. A method of fabricating a reconstituted wafer comprising:
- mounting a plurality of groups of die sets face up onto a first carrier substrate, wherein each die set includes a first die and a second die, the first die including a first die-level back end of the line (BEOL) build-up structure including damascene interconnects, and the second die including a second die-level BEOL build-up structure including damascene interconnects; and
- depositing a gap fill material onto the first carrier substrate and laterally surrounding each die of the plurality of groups of die sets, wherein the gap fill material comprises a silicon matrix.

16. The method of claim 15, further comprising building a reconstituted chip-level back end of the line (BEOL) build-up structure on the plurality of groups of die sets and the gap fill material, wherein the reconstituted chip-level BEOL build-up structure includes damascene interconnects.

17. A wafer on wafer process comprising:
- bonding a first reconstituted wafer of known good dies to a second reconstituted wafer of known good dies;
- wherein the first reconstituted wafer of known good dies includes an array of dies embedded in a silicon matrix gap fill material, and each die in the array of dies includes a first die-level back end of the line (BEOL) build-up structure including damascene interconnects.

18. The wafer on wafer process of claim 17, further comprising singulating a plurality of 3D reconstituted chips.

19. The wafer on wafer process of claim 17, wherein the second reconstituted wafer of known good dies includes a second array of dies embedded in a second silicon matrix gap fill material.

* * * * *